United States Patent
Ellis et al.

(10) Patent No.: US 11,322,648 B2
(45) Date of Patent: May 3, 2022

(54) PHOTON SOURCE AND A METHOD OF FABRICATING A PHOTON SOURCE

(71) Applicant: Kabushiki Kaisha Toshiba, Minato-ku (JP)

(72) Inventors: David Julian Peter Ellis, Cambridge (GB); James Lee, Cambridge (GB); Anthony John Bennett, Cambridge (GB); Andrew James Shields, Cambridge (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/923,314

(22) Filed: Jul. 8, 2020

(65) Prior Publication Data

US 2020/0343409 A1 Oct. 29, 2020

Related U.S. Application Data

(63) Continuation of application No. 15/689,230, filed on Aug. 29, 2017, now abandoned.

(30) Foreign Application Priority Data

Oct. 14, 2016 (GB) .................................... 1617432

(51) Int. Cl.
   *H01L 33/06* (2010.01)
   *H01L 27/15* (2006.01)
   (Continued)

(52) U.S. Cl.
   CPC .............. *H01L 33/06* (2013.01); *H01L 27/15* (2013.01); *H01L 33/0012* (2013.01);
   (Continued)

(58) Field of Classification Search
   None
   See application file for complete search history.

(56) References Cited

U.S. PATENT DOCUMENTS

6,043,104 A * 3/2000 Uchida .................. B82Y 20/00
                                                              257/94
6,470,039 B1   10/2002 Ukita
                     (Continued)

FOREIGN PATENT DOCUMENTS

GB   2 440 850   2/2008
GB   2 449 290   11/2008
                 (Continued)

OTHER PUBLICATIONS

British Examination Search Report dated Feb. 15, 2017 in Great Britain Application 1617432.8, filed on Oct. 14, 2016.
(Continued)

*Primary Examiner* — Vincent Wall
(74) *Attorney, Agent, or Firm* — Oblon, McClelland, Maier & Neustadt, L.L.P.

(57) ABSTRACT

A method for using a photon source, which includes a semiconductor structure having a first light emitting diode region, a second region including a quantum dot, a first voltage source, and a second voltage source, is provided. The method includes steps of applying an electric field across said first light emitting diode region to cause light emission by spontaneous emission, wherein the light emitted from said first light emitting diode region is absorbed in said second region and produces carriers to populate said quantum dot; and applying a tuneable electric field across said second region to control the emission energy of said quantum dot, wherein the light emitted from the second region exits said photon source.

17 Claims, 18 Drawing Sheets

(51) Int. Cl.
  *H01L 33/00* (2010.01)
  *H01L 33/08* (2010.01)
  *H01L 33/10* (2010.01)
  *H01S 5/34* (2006.01)
  *H04B 10/548* (2013.01)
  *H04B 10/70* (2013.01)
  *H01L 33/50* (2010.01)

(52) U.S. Cl.
  CPC ............ *H01L 33/08* (2013.01); *H01L 33/105* (2013.01); *H01S 5/3412* (2013.01); *H01S 5/3416* (2013.01); *H04B 10/548* (2013.01); *H04B 10/70* (2013.01); *H01L 33/502* (2013.01)

(56) References Cited

U.S. PATENT DOCUMENTS

2002/0176474 A1* 11/2002 Huang .................. B82Y 10/00
                                                    372/96
2004/0105481 A1*  6/2004 Ishida ................... C09K 11/62
                                                    372/108
2014/0252312 A1*  9/2014 Lumb ................... H01L 29/205
                                                    257/14
2015/0244151 A1*  8/2015 Liu ........................... H01S 5/02
                                                    372/44.01
2015/0304051 A1* 10/2015 Yuan ...................... H04B 10/70
                                                    398/188

FOREIGN PATENT DOCUMENTS

| | | |
|---|---|---|
| GB | 2475099 | 5/2011 |
| GB | 2476926 | 7/2011 |
| GB | 2531568 | 4/2016 |
| JP | 2006-222394 | 8/2006 |
| JP | 2007-533126 A | 11/2007 |
| WO | WO 2011/055119 A2 | 5/2011 |

OTHER PUBLICATIONS

Roland Enzmann, et al. "Towrads an Electro-Optically Driven Single Photon Device", 6th IEEE Conference on Nanotechnology (NANO), 2006, 4 pages.

* cited by examiner growth S401
- Growth of Bragg mirror
- Growth of bottom p-layer
- Growth of lower barrier layer
- Growth of quantum dot and surrounding i-layer
- Growth of upper barrier layer
- Growth of n-layer
- Growth of region 5 i-layer
- Growth of top p-layer fabrication S402
- Define top contact
- Spin resist and define top p-contact, develop
- Deposit top p-metal and lift off, anneal if required
- Define upper mesa
- Deposit dielectric layer (if required)
- Spin resist and define n-level shape, develop
- Dry etch dielectric hard mask (if required)
- Etch semiconductor down to n-type layer
- Remove mask layers
- Define middle (n) contact
- Spin resist and define n-type contact area, develop
- Deposit n-metal and lift off, anneal
- Define lower mesa
- Deposit dielectric layer (if required)
- Spin resist and define bottom p-level shape, develop
- Dry etch dielectric mask (if required)
- Etch semiconductor down to bottom p-layer
- Remove mask layers
- Define bottom contact
- Spin resist and define bottom p-contact, develop
- Deposit bottom p-metal and lift off, anneal if required

PHOTON SOURCE AND A METHOD OF FABRICATING A PHOTON SOURCE

CROSS-REFERENCE TO RELATED APPLICATIONS

This application is a continuation of U.S. patent application Ser. No. 15/689,230, fed on Aug. 29, 2017, which is based upon and claims the benefit of priority from United Kingdom Patent Application No. 1617432.8, filed on Oct. 14, 2016; the entire contents of which are incorporated herein by reference.

FIELD

Embodiments described herein relate generally to photon sources and methods of fabricating photon sources.

BACKGROUND

Photon sources have a wide range of applications, for example in sensing or metrology apparatus such as strain, pressure or temperature sensors, spectroscopy apparatus or distance measurement apparatus. Sources of short light pulses are also used in optical communications applications, for example applications using phase shift encoding with a modulation technique such as quadrature phase shift keying, or quantum communication systems.

Photon sources can be operated to output single photons or pairs of photons on demand, for example. In the field of quantum cryptography, there is a need to reliably produce single photons. A photon source based on quantum dots can produce single photons. In the field of quantum cryptography, quantum imaging and quantum computing there is a need to produce pairs of photons. Such photons can be created from a cascade emission process in single quantum dots initially filled with two electrons and two holes, a "biexciton state".

BRIEF DESCRIPTION OF THE FIGURES

Embodiments will now be described with reference to the following figures;

FIG. 17 shows a flow chart of a method of growth and fabrication of a semiconductor structure which is part of a photon source in accordance with an embodiment;

DETAILED DESCRIPTION

Figure 1:
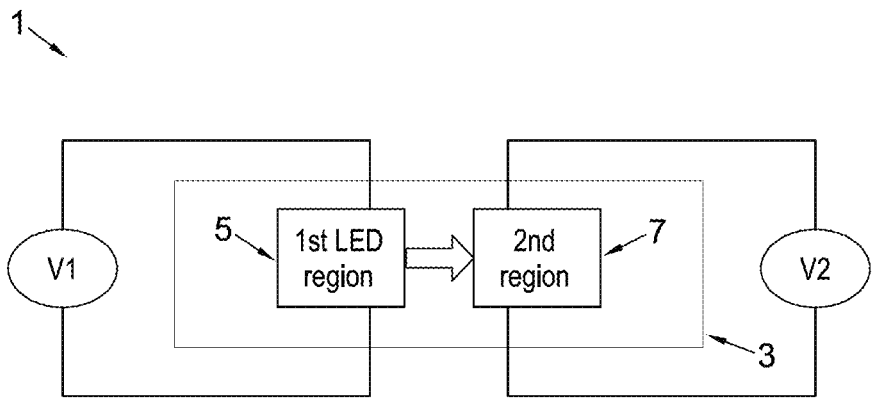
FIG. 1 is a schematic illustration of photon source in accordance with an embodiment.

According to one embodiment, there is provided a photon source, comprising:
  a semiconductor structure, said semiconductor structure comprising:
    a first light emitting diode region; and
    a second region comprising a quantum dot;
  the photon source further comprising:
    a first voltage source configured to apply an electric field across said first light emitting diode region to cause light emission by spontaneous emission;
    a second voltage source configured to apply a tuneable electric field across said second region to control the emission energy of said quantum dot;

wherein the semiconductor structure is configured such that light emitted from said first light emitting diode region is absorbed in said second region and produces carriers to populate said quantum dot and wherein the photon source is configured such that light emitted from the second region exits said photon source.

In an embodiment, the first voltage source is configured to apply an electric field across said first light emitting diode region to cause light emission by spontaneous emission only.

In an embodiment, the semiconductor structure comprises a substrate, and the first light emitting diode region and the second region are monolithically integrated with the substrate. In other words, the first light emitting diode region and the second region are grown monolithically with the substrate.

The energy of the light emitted from the first light emitting diode region is greater than the energy of the light emitted from the second region. In an embodiment, the emission spectrum as a function of wavelength of the light emitted from the first light emitting diode region has a peak at a first wavelength, and wherein the emission spectrum as a function of wavelength of the light emitted from the second region has a peak at a second wavelength, wherein the first wavelength and the second wavelength are different. In an embodiment, the first region excites the second region at a higher energy than that at which the quantum dot emission occurs.

The emission spectrum of the first region is substantially matched to the absorption spectrum of the second region. In an embodiment, the absorption spectrum of the second region has features which originate from the semiconductor band gap, wetting layer and quantum dot. The features of the absorption spectrum substantially match the features of the emission spectrum of the first region.

In an embodiment, the excitation light from the first region is incoherent. The light may comprise emission predominantly from the bulk bandgap and the 2D wetting later around the quantum dots for example, i.e. emission from all materials in the first region. In an embodiment, the emission from the first region is spectrally broad and has a peak at a different wavelength to the emission from the second region.

In an embodiment, the semiconductor structure further comprises one or more further regions, each comprising a quantum dot;

wherein the photon source further comprises:
a voltage source corresponding to each further region, configured to apply a tuneable electric field across the further region to control the emission energy of said quantum dot;
wherein the semiconductor structure is configured such that light emitted from said first light emitting diode region impacts said n or more further regions and produces carriers to populate said quantum dot; and
wherein the photon source is configured such that light emitted from the one or more further regions exits said photon source.

In an embodiment, there are three further regions.

In an embodiment, the second region is arranged at least partly around the first light emitting diode region. In an embodiment, the first region is substantially circular, and the second region is ring shaped and arranged concentrically around the first region. Alternatively, the second region may be U-shaped.

In an embodiment second region comprises a plurality of quantum dots. In an embodiment, light emitted from said first light emitting diode region produces carriers to populate said quantum dots. In an alternative embodiment, emission is only utilised from one quantum dot. This may be achieved by only providing carriers to one quantum dot or by providing carriers to many quantum dots but blocking emission from all but one quantum dot. Thus, said source may further comprise an electrically insulating layer provided with an aperture configured to allow carrier injection into a single quantum dot. Also, said source may further comprise an opaque layer configured to isolate the emission from one quantum dot.

In an embodiment, said photon source is configured such that emission from a single quantum dot exits said photon source.

In an embodiment, the second region is provided on the same surface of the substrate as the first region and is next to the first region in the plane parallel to the surface of the substrate, that is the first region and the second region are laterally arranged on the substrate. In an embodiment, the first region and the second region comprise the same arrangement of semiconductor layers.

In an embodiment, the first voltage source and the second voltage source are connected to the semiconductor structure through a shared electrode.

In an embodiment, the photon source is configured to direct light emitted from the first region in the in-plane direction toward the second region. In a further embodiment, the photon source is configured to direct light emitted from the second region in the in-plane direction. Alternatively, the photon source is configured to direct light emitted from the second region in the out of plane direction.

In an embodiment, a waveguide region is provided between the first region and the second region. The waveguide region may comprise a different arrangement of semiconductor layers to the first region and the second region. Alternatively, the first region, second region and waveguide region comprise the same arrangement of semiconductor layers, and the waveguide region is defined by a gap etched partially through said semiconductor structure on each side of the waveguide region.

In an embodiment, the first light emitting diode region is arranged underlying the second region, i.e. between the second region and the substrate. The photon source is configured to direct light emitted from the first region in the out of plane direction toward the second region. The photon source is configured to direct light emitted from the second region in the out of plane direction. Alternatively, the photon source is configured to direct light emitted from the second region in the in-plane direction.

In an embodiment, the first light emitting diode, region is arranged overlying the second region. The photon source is configured to direct light emitted from the first region in the out of plane direction toward the substrate. The photon source is configured to direct light emitted from the second region in the in-plane direction. The second region may be integrated with a waveguide region. A grating may be provided to direct light emitted from the second region to the waveguide region.

In an embodiment, the second region integrated with a waveguide region.

In an embodiment the first voltage source is configured to apply a time varying electric field to the first light emitting diode region and the second voltage source is a DC voltage source. Alternatively, the second voltage source is configured to apply a time varying electric field to the second region and the first voltage source is a DC voltage source.

In an embodiment, the photon source is configured such that the electric field is tuneable across an operating range having an upper limit of 100 KVcm$^{-1}$.

In an embodiment the second region comprises one or two barrier layers. The barrier layers may be a semiconductor layer having a higher band gap than the other semiconductor layers in the second region.

In an embodiment, there are barrier layers of the same material and equal thickness. Alternatively, the barrier layers may be different material and/or unequal thickness. The barrier regions may be of different heights in terms of their potentials. They may also be of different widths measured in the direction of the applied electric field. In one embodiment, a barrier with a larger potential than said quantum well layer is only provided on one side of the quantum well. This barrier suppresses electron tunnelling.

In an embodiment, the photon source has a p-i-n structure, where the quantum dot is located in the intrinsic region and p and n type contacts are provided on either side of the 'i' region. In an embodiment, the second region comprises an n-doped semiconductor layer, an un-doped semiconductor layer comprising the quantum dot and a p-doped semiconductor layer. A barrier layer may be provided between the undoped semiconductor layer and the n-doped semiconductor layer. A barrier layer may be provided between the undoped semiconductor layer and the p-doped semiconductor layer.

In an embodiment, the second region comprises a quantum well structure in one embodiment, the second region comprises a quantum well structure defined by the barrier layers and the quantum dot is located in the quantum well. The barrier layers are configured such that a quantum well is formed even in the absence of the quantum dots. The quantum dots are then provided in this well. The quantum well may have a square confinement potential or a graded confinement potential such as a triangular or parabolic potential.

The quantum well of said photon source may comprise a material having a lower band gap than said barrier layers, and wherein said lower band gap material is provided between two barrier layers.

In an embodiment, the barrier layer has at least a higher potential, for at least a part of its thickness, than the lowest electron energy level in said quantum dot. Where a quantum well is provided, the barriers, at least on the side of the quantum dot, where electron tunnelling will occur, may have a higher potential than the lowest electron energy level of said quantum well.

In an embodiment, the quantum dot is embedded in a quantum well clad with a layer of higher bandgap energy material, for example AlGaAs with Al content greater than 50%, so as to suppress tunnelling of carriers out of the quantum dot when an electric field is applied over the operating range.

In an embodiment, the quantum dot comprises InAs, said quantum well comprises GaAs, and said at least one barrier region comprises AlGaAs or AlAs. The quantum well may also comprise AlGaAs and said, barriers comprise AlGaAs, but in this situation, the barriers comprise AlGaAs with a higher Al content such that they provide a barrier to the quantum well. In an embodiment, the Al content of the barrier layers is greater than 50%. Where the quantum well is graded, GaAs may be provided at the centre of the well where the quantum dot is located.

A plurality of quantum dots may be provided in the undoped region. Further layers, such as barrier layers, may be provided such as higher band gap layers which may for example be AlGaAs, InAlAs, InAsP or InAlAsP. The semiconductor substrate may be GaAs for example, or InP. The quantum dots may be InAs or some other alloy. The layers form a p-i-n-type structure. The dots may be formed by self-assembly, droplet epitaxy, pre-positioned or lithographically defined in the device.

The first layer may also comprise one or two barrier layers and a quantum well structure.

In an embodiment, the tunnelling time of carriers from said quantum dot is greater than the radiative decay time of an exciton in said quantum dot over said operating range.

In an embodiment, said quantum dot comprises a neutral exciton, a bi-exciton or higher order exciton, and wherein the field applied across the second region is configured to minimise fine structure splitting.

In an embodiment, the photon source further comprises a waveguide region configured to guide light emitted from the first light emitting diode region to the second region.

In an embodiment, the distance between the first light emitting region and the second light emitting region is less than 1 mm.

In an embodiment, the second region comprises an optical cavity region, wherein the quantum dot is located in the optical cavity region. The emission energy of the quantum dot may be tuned to the resonance of the cavity.

In an embodiment, the light emitted from said first light emitting diode spontaneous photons that are not amplified by stimulated emission.

In an embodiment, light emitted from the first light emitting diode region has a greater intensity light emitted from the second region.

In an embodiment there is provided a system for producing entanglement, said system comprising a first photon source and a second photon source each comprising a semiconductor structure, said semiconductor structure comprising: a first light emitting diode region; and a second region comprising a quantum dot; the photon source further comprising: a first voltage source configured to apply an electric field across said first light emitting diode region to cause light emission; a second voltage source configured to apply a tuneable electric field across said second region to control the emission energy of said quantum dot; wherein the semiconductor structure is configured such that light emitted from said first light emitting diode region is absorbed in said second region and produces carriers to populate said quantum dot; and wherein the photon source is configured such that light emitted from the second region exits said photon source, and wherein said first and second photon sources are tuned to emit identical photons said system further comprising an interference component configured to provide entanglement between identical photons output from the two sources.

In an embodiment there is provided a quantum repeater comprising a first photon source, a second photon source and an interference component configured to interfere first photon from a pair of photons output by said first source and a photon from the second source, wherein the first photon source and the second photon source each comprise a semiconductor structure, said semiconductor structure comprising: a first light omitting diode region; and a second region comprising a quantum dot; the photon source further comprising: a first voltage source configured to apply an electric field across said first light emitting diode region to cause light emission; a second voltage source configured to apply a tuneable electric field across said second region to control the emission energy of said quantum dot, wherein semiconductor heterostructure is configured such that light emitted from said first light emitting diode region is absorbed in said second region and produces carriers to populate said quantum dot; and wherein the photon source is configured such that light emitted from the second region exits said photon source, wherein the first photon source is configured to output an entangled pair of photons wherein one of the photons is identical to a photon outputted by the second photon source, such that during interference by said interference component, the state of a photon emitted by the second photon source is mapped to the second photon from said photon pair.

According to another embodiment, there is provided method of using a photon source, the photon source comprising a semiconductor structure, said semiconductor structure comprising: a first light emitting diode region; and a second region comprising a quantum dot; the photon source further comprising: a first voltage source and a second voltage source, the method comprising:
- applying an electric field across said first light emitting diode region to cause light emission by spontaneous emission, wherein the light emitted from said first light emitting diode region is absorbed in said second region and produces carriers to populate said quantum dot;
- applying a tuneable electric field across said second region to control the emission energy of said quantum dot, wherein the light emitted from the second region exits said photon source.

According to another embodiment, there is provided a method of fabricating a photon source, comprising the steps of:
i) forming a semiconductor structure, comprising a first light emitting diode region and a second region comprising a quantum dot, on a semiconductor substrate, wherein the semiconductor structure is configured such that light emitted from said first light emitting diode region impacts said second region and produces carriers to populate said quantum dot and wherein the photon source is configured such that light emitted from the second region exits said photon source;
ii) electrically coupling a first voltage source to the first light emitting diode region, the first voltage source configured to apply an electric field across said first light emitting diode region to cause light emission by spontaneous emission;
iii) electrically contacting a second voltage source to the second region, the second voltage source configured to apply a tuneable electric field across said second region to control the emission energy of said quantum dot.

In an embodiment, forming the semiconductor structure comprises growing the first light emitting diode region and the second region on the same substrate.

FIG. 1 is a schematic illustration of a photon source 1 in accordance with an embodiment.

The photon source comprises a semiconductor heterostructure 3 comprising a first light emitting diode region 5 and a second region 7. The first region 5 and the second region 7 are integrated on a semiconductor substrate. They may be monolithically integrated on the substrate, i.e. monolithically grown on the substrate.

The second region 7 comprises a quantum dot (not shown). The second region may comprise a plurality of quantum dots.

The first region 5 comprises a diode structure, which emits light when activated. For example, the first region 5 may comprise a p-i-n diode. A first voltage source V1 is configured to apply an electric field across said first light emitting diode region 5 to cause light emission. When a suitable voltage is applied to the leads contacting the first region 5, electrons are able to recombine with holes within the first region 5, releasing energy in the form of photons. The first region 5 emits light by spontaneous emission.

The light emitted from the first region 5 impacts the second region 7 and produces carriers to populate the quantum dot. Thus carriers are injected into the quantum dot by optical excitation, causing photon emission from the quantum dot.

Light emitted from the first region 5 is absorbed in the second region 7. One or more photons emitted from the first region 5 produce optical excitation of the quantum dot in region 7.

A second voltage source V2 is configured to apply a tuneable electric field across the second region 7 to control the emission energy of the quantum dot. By setting the voltage applied by source V2, it is possible to control the emission wavelength of the quantum dot it is also possible to control the fine structure splitting of the quantum dot.

The photon source 1 is configured such that light emitted from the second region 7 exits the photon source 1.

Inclusion of the optical excitation mechanism, i.e. the first light emitting diode region in the same heterostructure as the second region 7 means low fabrication and assembly complexity, as well as enabling a compact photon source to be produced.

The optical coupling between the two regions is defined lithographically during fabrication, meaning that no subsequent optical alignment procedures are needed.

The device can thus be miniaturized, produced in large volumes by standard photolithographic techniques and tuned to a fixed energy so that the emitted photons are compatible with further components.

Figure 2:
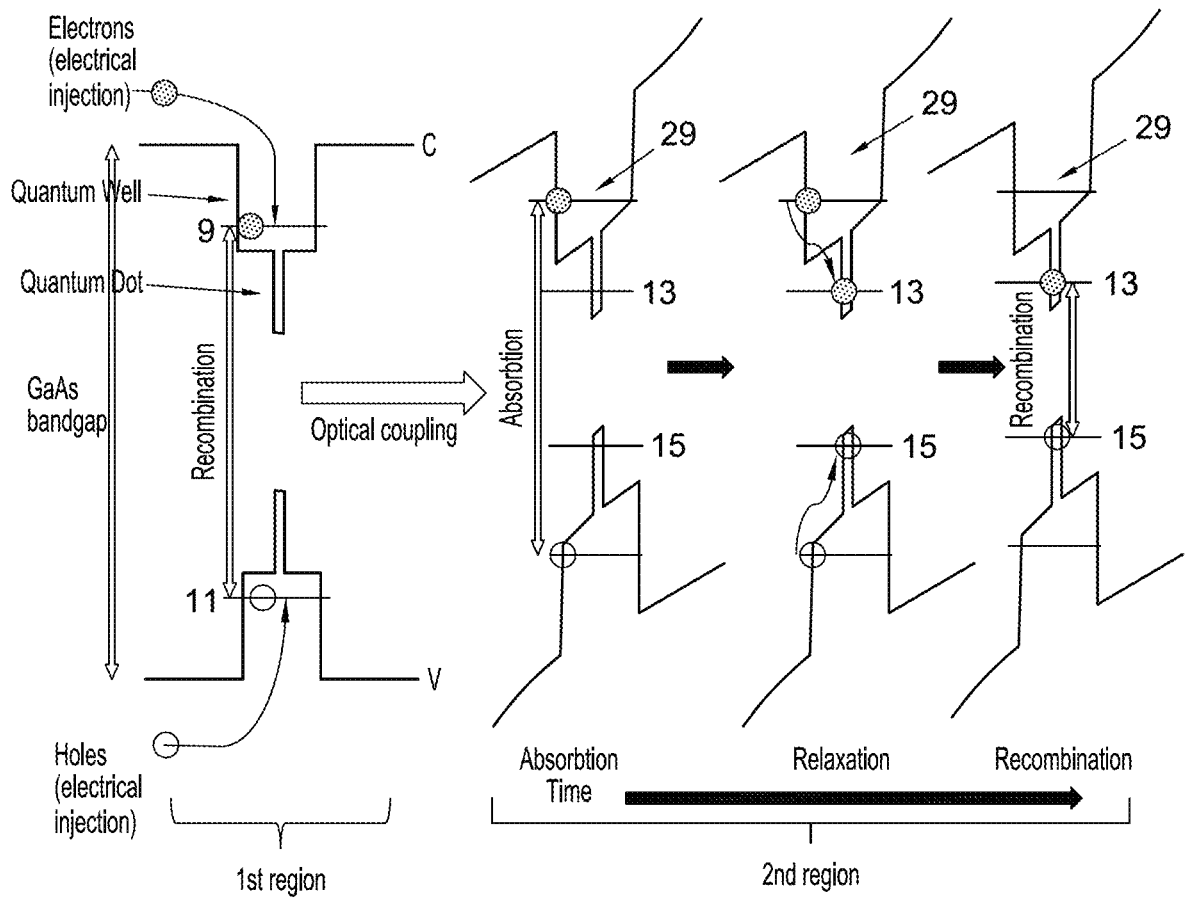
FIG. 2 is a schematic illustration of the electronic band structure of the photon source.

FIG. 2 is a schematic illustration of the electronic band structure of the semiconductor structure of the photon source 1.

The band diagram relates to the case where region 5 comprises a p-i-n diode integrated on a GaAs substrate. Carriers are injected by electrical excitation provided by the first voltage source V1. Electrons and holes recombine in many areas within the device including for example the bulk GaAs, quantum well around the quantum dots (QD), InAs wetting layer and QDs themselves, resulting in the emission of photons.

The band diagram shows the conduction band C and the valence band V for both regions. A quantum well in the first region 5 contains an electron 9 in the conduction band C and a hole 11 in the valence band V. This quantum well, shown around the dots, could be formed from the natural InAs wetting layer accompanying S—K grown quantum dots, or from an epitaxially grown GaAs/AlGaAs quantum well that surrounds the quantum dots.

The heterostructure in the first, region 5 will emit a photon if the electron 9 in the conduction band C and the hole 11 in the valence band V combine. This photon then travels to the second region 7, for example it may be guided to the second region 7 by a waveguiding structure. It excites a continuum of states in the second region such as the GaAs bandgap, energy levels of the InAs wetting layer and the GaAs/AlGaAs quantum well for example. These photo-induced electrons and holes will then relax to the ground states of the quantum then combine to emit a photon.

For the second region 7, FIG. 2 shows the evolution of the carrier population with time. The first band diagram of the second region 7 shows the absorption stage, in which the photon emitted from the first region 5 is absorbed in the second region 7 exciting states. A quantum well in the first region 5 contains an electron 9 in the conduction band C and a hole 11 in the valence band V. This quantum well, shown round the dots, could be formed from the natural InAs wetting layer accompanying S—K grown quantum dots, or from the epitaxially grown GaAs/AlGaAs quantum well that surrounds the quantum dots. The second band diagram shows the relaxation into the ground states of the QD. The final band diagram shows recombination.

The quantum, dot will emit radiation if the electron 13 in the conduction band C and the hole 15 in the valence band V combine to emit a photon. The presence of a single electron 13 in the conduction band and a single hole 15 in the valence band forms a bound state termed a single exciton X.

FIG. 2 shows simplified arrangement where there is just a single neutral exciton present in the first region 5 and the second region 7. However, the formation of bi-excitons which comprise two electrons in the conduction band and two holes in the valence band or charged excitons where there are uneven numbers of electrons and holes is also possible.

In a quantum dot, an exciton is formed when there is a bound state between a small number of electrons in the conduction band and holes in the valence band. Radiative decay occurs when one hole and one electron recombine resulting in the emission of a photon. Due to the generation process, the time at which the photon is emitted can be carefully controlled and such a process cannot give rise to the emission of two photons at the same time due to the Pauli Exclusion principle. The wavelength of the emitted photon depends on the energy difference between the initial and final electronic states.

The emission of a photon is suppressed if either the electron 13 or the hole 15 tunnels out of the quantum dot.

Barrier layers may be provided to suppress tunnelling of the carriers out of the quantum dot before recombination.

When a vertical electric field is applied to the quantum dot, the probability of tunnelling increases and the emission efficiency of the device falls. It is possible to suppress tunnelling further by increasing the barrier height, i.e. by increasing the confinement potential.

In use, the first region 5 is operated in forward bias such that it emits photons by electroluminescence, electric field is applied between the first p contact and the n contact by the first voltage source V1, such that photons are emitted. For example, where the first region 5 comprises quantum dots, a voltage is applied at a first level which is greater than the threshold voltage of the first light emitting diode region so that electrons and holes can populate the quantum dot, and light is emitted when they recombine.

The photons emitted from the first region 5 impact the second region 7 and are absorbed, producing carriers which populate the one or more quantum dots in the second region 7. The carriers then relax and result in photon emission from the second region 7.

The voltage applied across the second p contact and n contact by the second voltage source V2 can be used to tune the emission energy of the quantum dot or dots in the second region 7 and thus the wavelength of the emitted photons from the second region 7.

The voltage applied to the second region 7 is applied perpendicular to the plane of the layers. The voltage is applied at a second level which is less than the threshold voltage of the second region. This voltage shifts the emission of the quantum dot via the Stark effect to an energy equal to the desired output energy of the device.

The energy, E, of a quantum-confined state in an electric field is shifted by the Stark effect according to the formula $$E = E_0 - pF + \beta F^2$$

Where $E_0$ is the energy at zero field, p the "permanent dipole" moment and $\beta$ the "polarizability" (which is negative), p gives a measure of the vertical separation between the electron and hole, p=eD, where D points from negative to positive charge. F is the applied electric field, defined as the net force on a positive test charge.

Thus the emission energy of the quantum dot or dots in the second region 7 is dependent on the applied electric field. The emission energy of the quantum dot or dots can be selected by selecting a value of voltage applied by the second voltage source V2. In this way the wavelength of the quantum dot emission is tuned.

As described above, a larger applied electric field means an increased probability of tunnelling. There is thus a maximum value of electric field which can be vertically, applied across the quantum dots whilst still allowing photoluminescence (PL) emission to occur. It is possible to increase this maximum value by increasing the barrier height for example. The higher the maximum value, the larger the wavelength tuning range. Including barrier layers can lead to tuning over a wavelength, range of more than 14 nm, as an electric field greater than 400 KV/cm may be applied without destroying emission efficiency. In an embodiment, the electric field is tuneable across an operating range having an upper limit of 100 KVcm$^{-1}$.

The emission wavelength may thus be tuned by applying an electric field across the quantum dot. Applying an electric field across the quantum dot causes the efficiency of the photon source to decrease, since the applied field enhances tunnelling of carriers out of the quantum dot before photon emission can occur. By minimising the tunnelling of both electrons and holes out of the quantum dot while an electric field is applied, a larger tuning range for the photon source may be achieved. Tunnelling may be minimised by the provision of barrier layers.

In an embodiment, the tunnelling time for both electrons and holes in the second region 7 is longer than the radiative lifetimes of excitons formed within the quantum dot. For InAs/GaAs quantum dots the X and X− states have lifetimes of 1 ns. This will ensure that the majority of carriers radiatively recombine, and keep efficiency above 50%. Tunnelling will generally occur from the quantum dot towards the contacts. Thus electrons will tunnel towards a n-type contact and holes towards a p-type contact.

Reducing the tunnelling from the quantum dots over the operating range may be achieved in a number of ways. Providing semiconductor layers between the quantum dot and the first and or second contacts provides a barrier to tunnelling, the barrier having at least a higher potential, for at least a part of its thickness, than the lowest electron energy level in said quantum dot. Where a quantum well is provided, the barriers, at least on the side of the quantum dot, where electron tunnelling will occur, may have a higher potential than the lowest electron energy level of said quantum well. Examples of structures in second region 7 which reduce tunnelling from the quantum dot are shown in FIG. 6.

The quantum dot energy levels may thus be Stark shifted to a desired energy by the application of an external bias V2. Inclusion of a barrier material in the device means that the tunnelling rate is low even at high applied bias. This allows efficient emission over a wide range of applied bias. For example, in an embodiment, a device can be tuned over several tens of nm.

Figure 3:
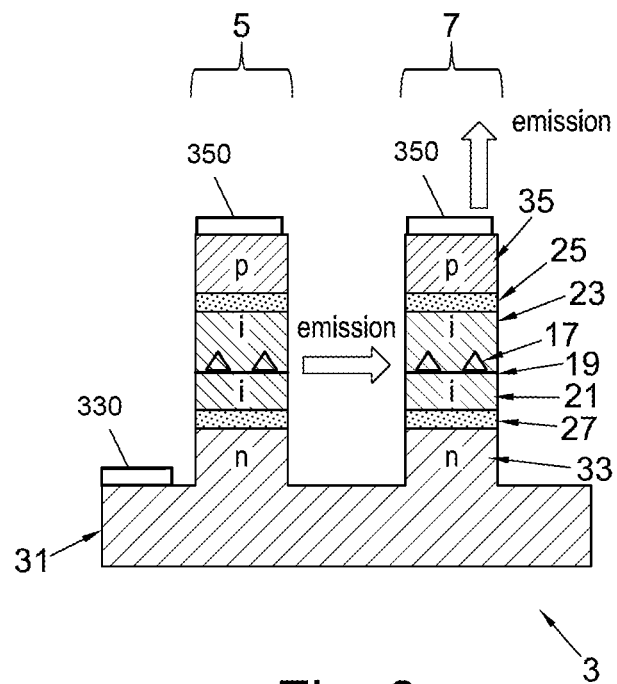
FIG. 3 is a schematic illustration of a semiconductor structure which is part of a photon source in accordance with an embodiment.

FIG. 3 is a schematic illustration of a semiconductor heterostructure 3 which is part of a photon source 1 in accordance with an embodiment.

The heterostructure comprises a first region 5 and a second region 7 integrated on a semiconductor substrate 31.

The first region 5 is a light emitting diode region. The first region 5 comprises an n-doped semiconductor layer provided on the substrate 31. The h-doped layer may be overlying and in contact with the substrate 31. Alternatively, a buffer layer (not shown) and/or other epitaxial layers (not shown) may be provided between the n-doped layer the substrate 31 for example.

An undoped layer is overlying and in contact h the n-doped layer. A plurality of quantum dots may be provided in the undoped region. A p-doped layer is provided overlying and in contact with the undoped layer. Further layers, such as barrier layers, may be provided such as higher band gap layers which may for example be AlGaAs, InAlAs, InAsP or InAlAsP. The semiconductor layers may be GaAs for example, or InP. The quantum dots may be InAs or some other alloy. The dots may be formed by self-assembly, droplet epitaxy, pre-positioned or lithographically defined in the device. The layers form a p-i-n-type structure. Although the device shown comprises an n-type substrate, alternatively, the device may comprise a p-type substrate, and the p-i-n junction be reversed in order.

The light emitted by the first region 5 may comprise emission from all the materials in the first region, i.e. the quantum dots and the bulk material. The emission may include emission from the wetting layer and/or emission from the bulk GaAs or InP material for example.

The second region 7 also comprises an n-doped layer 33 provided on the substrate 31. The n-doped layer 33 may be overlying and in contact with the substrate 31. Alternatively, a buffer layer (not shown) may be provided between the n-doped layer 33 and the substrate 31 for example.

In the second region 7, a lower barrier layer 27 is overlying and in contact with the n-doped layer 33. An undoped layer 21 is overlying and in contact with the lower barn layer 27. One or more quantum dots, including the quantum dot 17, are provided in the undoped region, which comprises the lower layer 21 and the upper layer 23. An upper barrier layer 25 and a p-doped layer 35 are provided overlying and in contact with the undoped layer 23. Further layers, may be provided over the p-doped layer 35. The semiconductor layers may be GaAs for example, or InP. The quantum dots may be InAs. The layers form a p-i-n-type structure.

A n-type contact 330 is provided on the opposite surface of the substrate 31. A first p-type contact 350 is provided above the p-doped layer in the first region 5. N-type metal contact 330 materials may include, but are not limited to AuGeNi or PdGe. The p-contact 350 metal may include, but is not limited to, AuBe, PdZnAu or AuCrAuZnAu. The first voltage source V2 is connected across the first p-type contact 350 and the n-type contact 330.

A second p-type contact 350 is provided above the p-doped layer 35 in the second region 7. The second voltage source V2 is connected across the second p-type contact 350 and the n-type contact 330.

Thus in the second region 7, the quantum dot 17 is formed at an interface 19 between a lower layer 21 and an upper layer 23. The quantum dot 17 may be an InAs quantum dot for example. The lower layer 21 and upper layer 23 may be Gallium Arsenide for example, or InP. The upper 23 and lower 21 layers are in contact with upper 25 and lower 27 barriers layers respectively. The upper and lower barrier layers 25 and 27 are higher band gap layers which may for example be AlGaAs, InAlAs, InAsP or InAlAsP.

An arrangement comprising upper and lower layers 23 and 21 sandwiched between the upper and lower barrier layers 25 and 27 results in the formation of a quantum well 29. The quantum well 29 is shown in the band diagram in FIG. 2.

The barrier layers are provided close enough, to the interface 19 where the quantum dot 17 is formed such that they provide a further degree of electrical confinement than if the barrier layers were not present. The upper and lower layers 23 and 21 form the quantum well 29.

Here, the quantum dot 17 is located in quantum well 29 which is formed by upper and lower layers 23 and 21. The quantum well 29 is formed between the upper and lower barrier layers 25 and 27 which serve to suppress tunnelling from the quantum dot 17.

The structure of the second region 7 is a p-i-n structure with one side of the device being p-type and the other, side n-type, and the quantum dot 17 located in the undoped region. However, the second region 7 may alternatively have an n-i-p or ohmic-i-schottky structure for example.

Furthermore, in the device shown there are two equal barriers, however the device may alternatively have unequal barriers, no barriers or a single barrier. Electrons and holes have different effective masses, and thus have equal tunnelling rates for unequal heights of barrier on either side of the quantum dot 17, meaning that unequal barriers, or one barrier may sufficiently suppress tunnelling.

In an embodiment, the spacing between the barriers is small enough to lead to quantisation of the electronic states within the quantum well 29. This occurs when the carriers are confined within a sufficiently strong potential to a region comparable to the de Broglie wavelength of the particles.

In an embodiment, the height, position or thickness of one or both of the barriers is selected such that the distance from the quantum dot 17 to the barrier is small enough such that there is not a confined state at the edge of the barrier where carriers could tunnel to.

The second region 7 is provided on the same surface of the substrate as the first region 5 and is next to the first region 5 in the plane parallel to the surface of the substrate that is the first region 5 and the second region 7 are laterally arranged on the substrate.

There may be a gap between the first region 5 and the second region 7. Alternatively, the first region 5 may contact the second region 7, or a waveguide region may be provided between the first region 5 and the second region 7 for example.

Figures 4A, 4B:
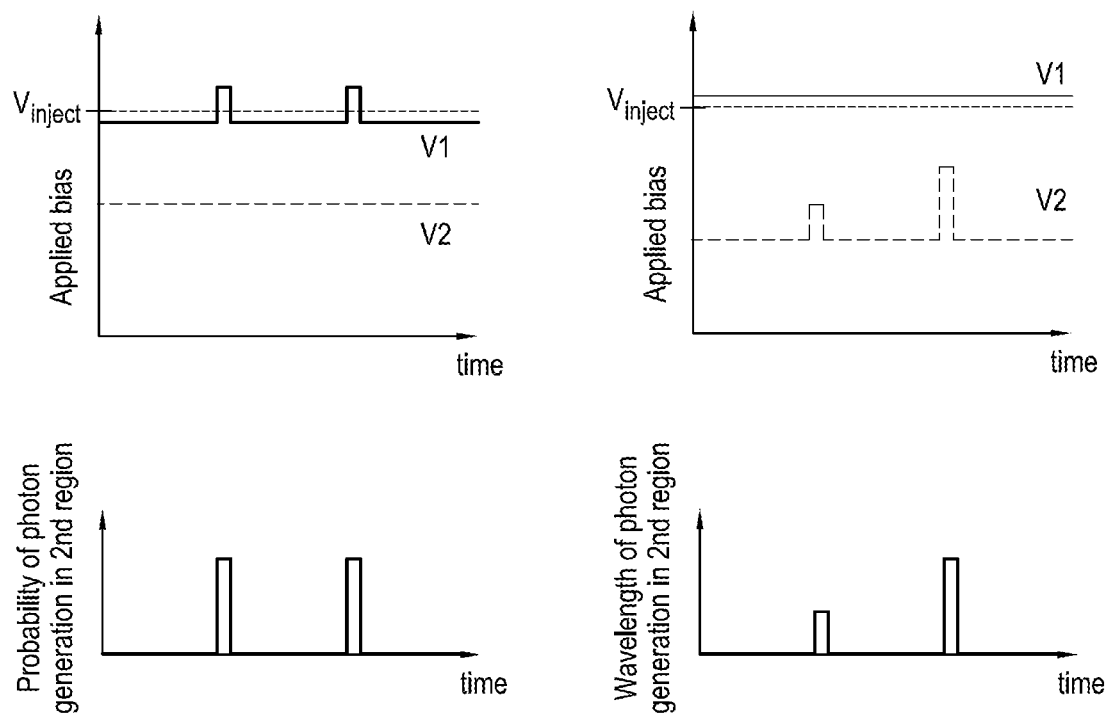
FIGS. 4(a) and 4(b) show examples of the applied voltages to the first region and the second region in the upper graphs and the probability of photon generation in the second region.

Examples of the applied voltages to the first region 5 and the sec shown in FIGS. 4(a) and 4(b). In each of these figures, one of the first region 5 and the second region 7 is subject to an oscillatory electric field that results in pulsed optical emission from the photon source 1.

The upper graph in FIG. 4(a) shows the voltage V1 applied to the first region 5 and the voltage V2 applied to the second region 7. In this case the voltage V1 applied to the first region 5 forms a series of pulses, and the voltage V2 applied to the second region 7 is continuous, i.e. is a DC voltage. Each voltage pulse applied to the first region 5 increases the voltage V1 above the threshold voltage level of the first region 5. Thus the first region 5 emits a pulse of light corresponding to each voltage pulse.

The emission energy of the quantum dot in the second region 7 depends on the size of the voltage V2 applied across the second region 7. The light emitted from the second region 7 is intensity modulated, since the light inputted from the first region 5 is pulsed. In other words, the first region 5 emits pulsed light. Each pulse is absorbed by the second region 7, which populates the second region 7 with carriers, which then relax and recombine in the OD emitting a single photon. The second region then does not emit another photon until the first region 5 emits another pulse.

The lower, graph in FIG. 4(a) shows the probability of photon generation in the second region 7. The probability of photon generation is increased each e the voltage pulse is lied to the first region 5.

The upper graph in FIG. 4(b) shows the voltage V1 applied to the first region 5 and the voltage V2 applied to the second region 7, in an alternative mode of operation. The voltage V1 applied to the first region is a continuous, or DC voltage. The voltage V2 applied to the second region 7 comprises a series of pulses. The voltage V1 applied to the first region 5 is larger than the threshold voltage level, and thus light is continuously emitted from the first region 5.

The energy of the light emitted from the second region 7 depends on the size of the voltage pulse V2 applied. Thus modulating the size of the voltage pulses V2 modulates the wavelength of the light emitted from the second region 7. The lower graph shows the wavelength of the photons emitted from the second region 7. The larger the voltage applied to the second region 7, the higher the wavelength of the emitted photons. The lower graph in FIG. 4(b) again shows the probability of photon generation in the second region 7. The probability of photon generation is increased each time the voltage pulse is applied to the second region 7.

In both cases the first region 5 is used as a light source to provide carriers to the quantum dot in the second region 7.

In an embodiment, the semiconductor hetero-structure comprises a layer of single quantum dots, which are subject to a position dependent electric field. The structure comprises a first region 5 where electroluminescence is observed, and a second region 7 where the quantum dot energy may be varied with electric field. The first region 5 optically excites the second region 7. The electric field applied to the first region may be different to the electric field applied to the second region 7.

Figure 5:
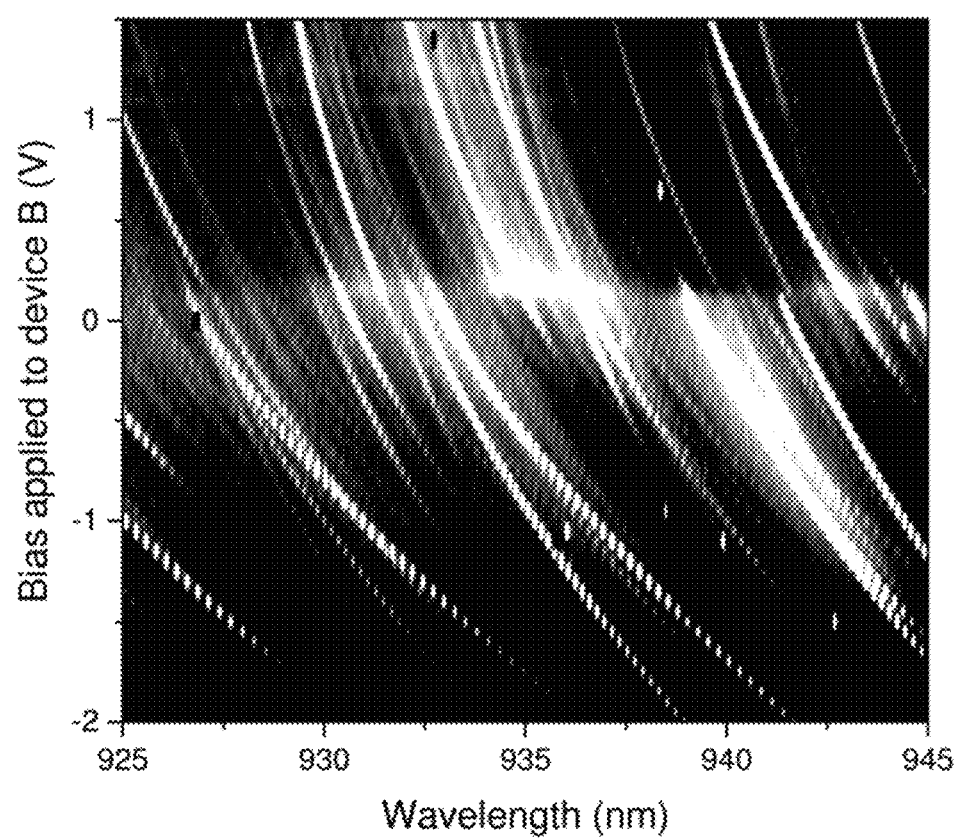
FIG. 5 shows the tuning of the emission spectrum from a photon source in accordance with an embodiment.

FIG. 5 shows the tuning of the emission spectrum from a photon source 1 in accordance with an embodiment. In this example, the device was created as in FIG. 3 and contained a single layer of InAs dots in a 10 nm GaAs quantum well clad with 75% AlGaAs. The bias on the first region 5 was set to be greater than the threshold voltage and constant. The bias on the second region 7 was varied and is plotted on the y axis. Consequently the energy of emission, plotted on the x axis, changes for the transitions in the quantum dots. In this example, a high density of quantum dots, in the second region 7 means there are many transitions visible whose intensity, indicated by the brightness on the plot, vary with the electric field. Several transitions are shown to shift by >10 nm.

Figure 6A:
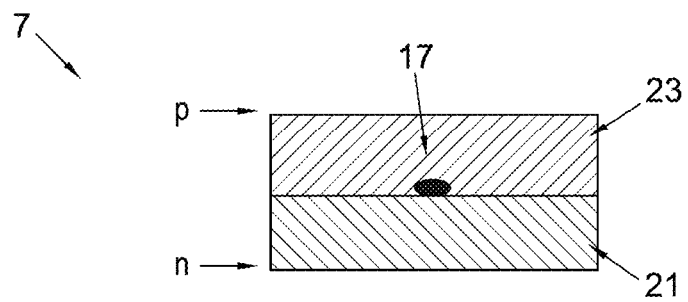
FIGS. 6(a) to (f) show examples of the second region structure which reduce tunnelling fro a quantum dot.
Figure 6B:
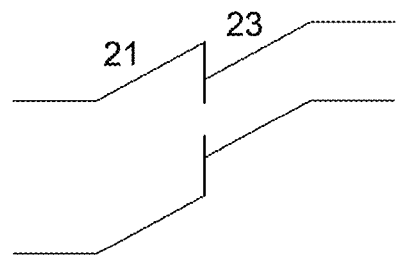
Figure 6C:
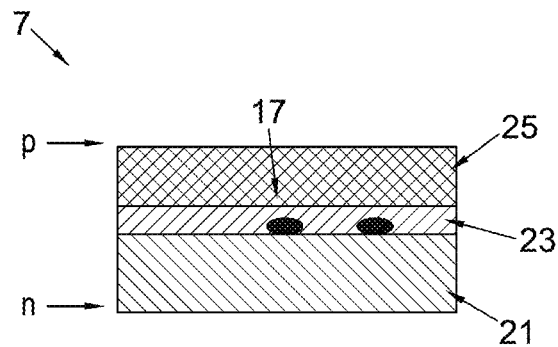

In an embodiment, the barrier layers in the second region 7 are unequal. For example, as shown in FIGS. 6(a) and (b), the lower layer 21, connected to the n-doped region, may have a higher band gap than the upper layer 23. As the effective mass of a hole in a quantum dot is much greater than the effective mass of an electron, the electron more likely to tunnel first. Therefore, a higher band gap material is provided on the n-type side of the quantum dot in order to inhibit tunnelling of the electron and to retain the electron and hole into the quantum dot long enough for emission to occur. For example, the upper layer 23 may be GaAs, the quantum dots InAs and the lower layer 21 is AlGaAs. In this configuration there is a "V" shaped quantum well at the side of the barrier, formed between the vertical potential step on one side, and the slope of the conduction band on the other. FIG. 6(b) shows the corresponding, band diagram.

Figure 6D:
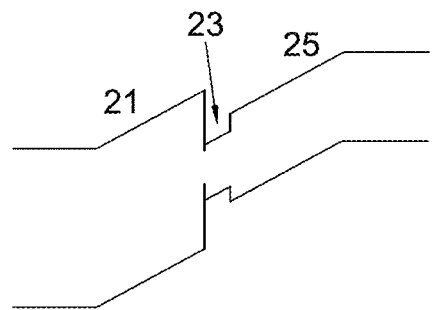

Alternatively, as shown in FIGS. 8(c) and (d), an upper barrier layer 25 may be provided, and no lower barrier layer provided. For example, the quantum dots n gay be formed in an GaAs region, and an upper barrier layer 25 formed of AlGaAs may be provided. FIG. 6(d) shows the corresponding band diagram.

Figure 6E:
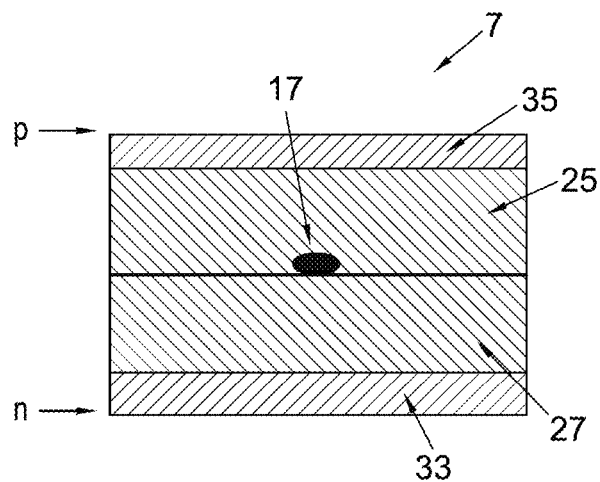
Figure 6F:
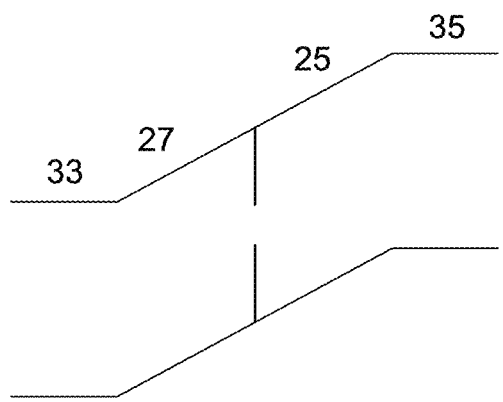

In an alternative embodiment, shown in FIGS. 6(e) and (f), the spacing between the potential barriers is reduced to a minimal value, in this case a high bandgap material still increases the confinement of the carriers. A plurality of quantum dots are formed at an interlace between two barrier materials 25 and 27. The lower barrier layer 27 is connected to an n-type material 33 and the upper barrier layer 25 is connected to a p-type material 35. For example, an InAs quantum dot is sandwiched between two barrier layers for example AlGaAs layers. The band gap of AlGaAs is 2.2 eV which is considerably larger than the 1.5 eV band gap seen in GaAs. The type material may be n doped GaAs and the p-type material may be p-doped GaAs for example.

By forming quantum dots in AlGaAs, large fields can be applied with carriers trapped in the dot. This can lead to tuning over a wavelength range of more 20 nm as greater than 400 KV/cm of field may be applied without destroying emission efficiency. In an embodiment, InAs dots are encapsulated in 75% AlGaAs in the second region 7, and the photon source 1 has a tuning range of greater than 10 s of nanometers.

Different types of quantum well arrangement may be used to confine the states in the quantum dot. A square type quantum well is described with reference to FIG. 2. A variable composition quantum well with a triangular profile may be formed, where carriers tend to accumulate at the lowest potential which is near the quantum dot. It is also possible to vary the composition such that the energy profile is parabolic, linear or some other varying profile. The confined states of the quantum well may be engineered to have a certain relation to the confined states of the quantum dot. For example, if the confined states of the quantum well are separated by one phonon energy, capture into the quantum dot may be enhanced.

In an embodiment, the heterostructure is configured to allow the dots to confine both signs of carrier over an electric field range of <100 kV/cm.

The enhanced confinement provided by the inclusion of barrier layers relay also allow the devices to be operated at higher temperatures.

As well as shifting the energy of the quantum dot emission via the Stark effect, the magnitude of the applied electric field can also be used to control the type of emission.

For example, one type of emission is emission due to a single neutral exciton X, where a single electron in the conduction band and a single hole in the valence band combine to leave the dot completely unoccupied, emitting a photon. Another type of emission is emission due to the neutral bi-exciton decay XX, where there are two electrons in the conduction band and two holes in the valence band, and one electron in the conduction band combines with a single electron in the valence band emitting a photon and leaving behind a single electron in the conduction band and a single hole in the valence band. Another type of emission is emission due to decay from a quantum dot which is populated with two electrons in the conduction band and a single hole in the valence band. One electron in the conduction band combines with the single hole in the valence band leaving behind a single electron in the conduction band. This decay is known as the negative exciton decay X−. Another type of emission is positive exciton decay X+, when the starting state is a single electron in the conduction band and two holes in the valence band. It is also possible to have charged decay of higher order exciton, for example, the exciton XX+ comprises three electrons in the conduction band and two holes in the valence band.

Different types of emission dominate at different voltages applied to the second region 7. Therefore, it is possible to control or favour a particular type of emission by varying the voltage applied by the second voltage source V2 to the second region 7.

In another embodiment, the electric field applied across the second region 7 is configured to minimise fine structure splitting (FSS) in the emitted photons. This allows a source of entangled photon pairs to be produced.

Pairs of photons can be created from a cascade emission process in single quantum dots initially filled with two electrons and two holes, known as a biexciton state XX. This an emit a biexciton photon leaving one electron and one hole in a charge-neutral exciton state. This electron and hole then recombine to emit an exciton photon leaving the dot empty. Through control of the properties of the exciton state these two photons can be entangled. To produce an entangled photon source it is desirable to have a quantum dot where there is no fine structure splitting in the photoluminescence from the quantum dot.

Controlling the voltage applied across the second region allows minimization of the fine structure splitting, which determines the entangled state. This occurs on the same chip as the excitation and photon emission. It is possible to operate the source at fields where fine structure splitting is minimised.

FSS is only visible in the emission of neutral exciton and bi-exciton states. These states have higher intensity emission when the FSS is minimised.

In an embodiment, the electric field applied to the second region minimizes the fine structure splitting of the quantum dot in the second region.

Figure 7:
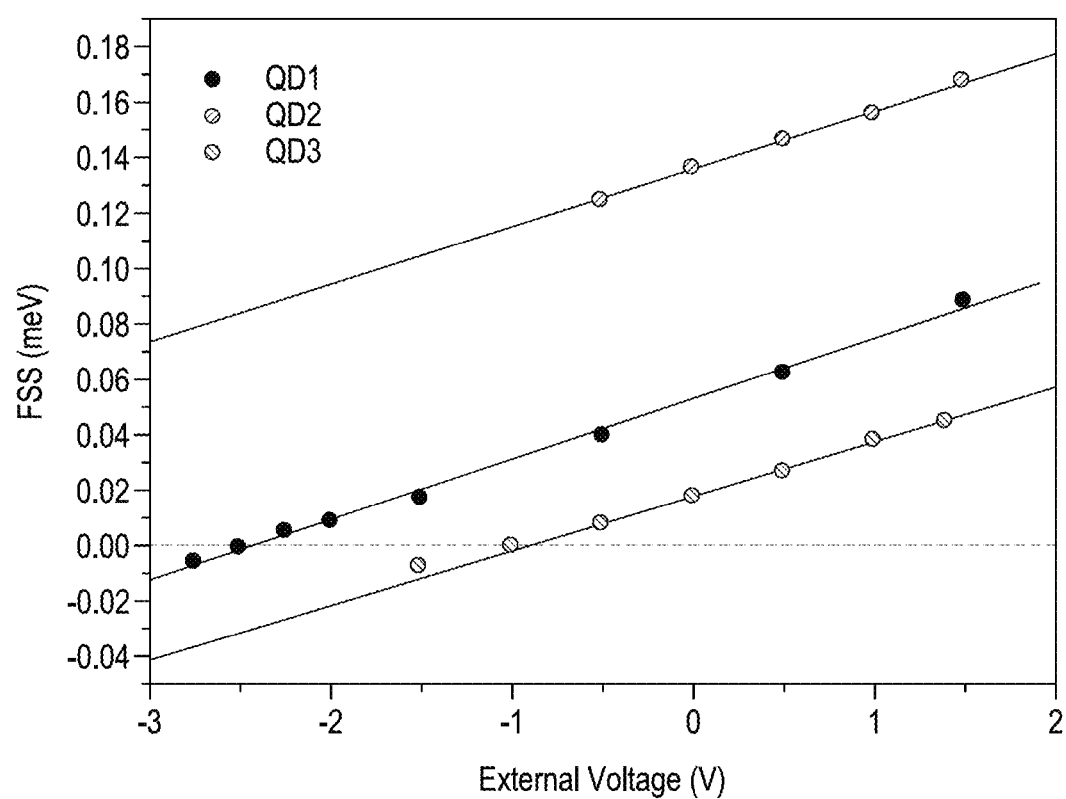
FIG. 7 shows the effects of applying a tuning voltage across a photon source in accordance with an embodiment.

FIG. 7 shows the effects of applying a tuning voltage across a photon source in accordance with an embodiment. The figure shows electrical tuning of the fine-structure splitting (FSS) of a quantum dot with applied bias.

The FSS is varied by varying the voltage. This allows variation on time scales comparable to or faster than the radiative lifetimes of the quantum states.

A voltage applied to the second region 7 can be used to minimise the fine structure splitting. In an embodiment, the FSS varies linearly with the applied voltage.

Quantum dots in GaAs/InAs/GaAs have randomly varying FSS, with a Gaussian distribution from dot to dot over a wide range. At 1.4 eV emission energy the mean FSS is zero, with "scatter" closer to 50 µeV. Again, this scatter can be reduced by applying a voltage to the second region. In an embodiment, the FSS changes at a rate of 0.28 µeV per KVcm$^{-1}$ when an electric field is applied to the second region 7. At 1.32 eV emission energy the mean FSS is ~100 µeV with a scatter of 100 µeV. A tuning range of 150 µeV will mean substantially all quantum dots can be tuned to a minimal FSS. This corresponds to a field of 530 KVcm$^{-1}$.

Growth of quantum dots on AlAs, instead of GaAs or MP, increases the shape-asymmetry of the QDs leading to a larger fine structure splitting. Quantum dots grown on AlGaAs are also known to have larger space asymmetry as the aluminium composition increases. Minimising the fine structure splitting by applying a voltage across the second region 7 is therefore particularly useful for these materials. Furthermore, the rate of change of the fine structure splitting with applied electric field is higher for dots grown within AlGaAs. A larger fraction of quantum dots can be tuned in these materials to minimise the fine structure splitting.

In an embodiment, the photon source 1 comprises a cavity (not shown). The cavity is provided around the quantum dot and may be provided around further quantum dots in the second region 7. The cavity may be configured to enhance emission in one direction thus increasing efficiency and/or to alter the emission properties of the quantum dot. The effective refractive index of the structure is modified such that an optical cavity is created around the quantum dot or dots in the second region 7. The cavity may be formed from Bragg mirrors (not shown) of quarter wavelength layers of alternating refractive index, or photonic crystals for example. The optical cavity may be formed by the inclusion of alternating layers of high and low refractive index, each of thickness $\lambda/4$. Profiling of the layers by etching or selective partial oxidation semiconductor layers with aluminium content of greater than 80% may also be used to form the cavity.

Figure 8:
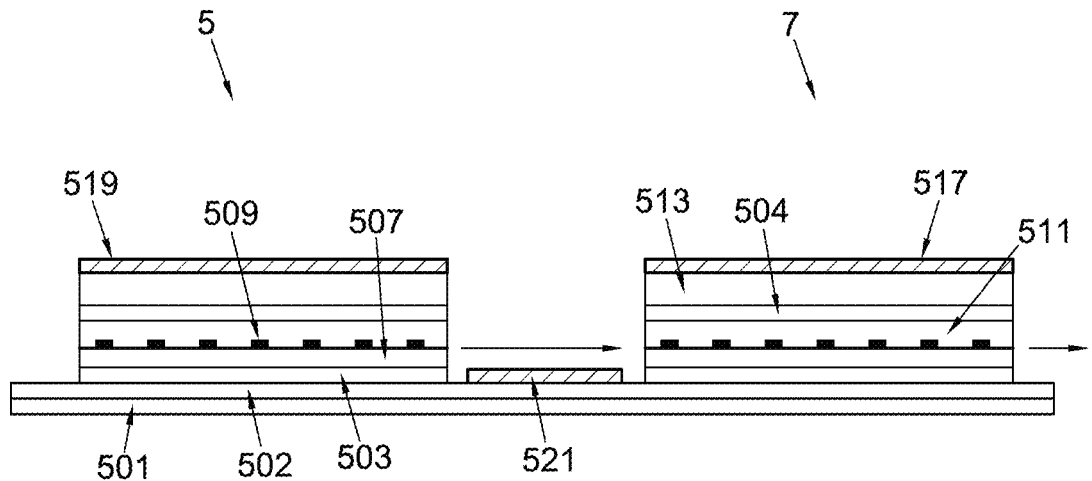
FIG. 8 shows a schematic illustration of a semiconductor structure which is part of a photon source in accordance with an embodiment, showing details of the layer structure.

FIG. 8 shows a semiconductor heterostructure of a photon source 1 in accordance with an embodiment, showing details of the layer structure.

The semiconductor heterostructure comprises a first region 5 and a second region 7 integrated on a first surface of a substrate 501. The substrate 501 may comprise a buffer layer (not shown). The substrate may be GaAs or InP for example. The substrate may also be doped. Although in this case, the n-type contact is made to the substrate, alternatively, the device may be reversed and the p-type contact made to the substrate.

Overlying and in contact with the substrate 501 the lower contact region 502. The lower contact region may be n-doped GaAs or InP for example. Overlying and in contact with the lower contact region 502 is the lower barrier region 503. The lower barrier region may be AlGaAs or InAlAs for example. Overlying and in contact with the r barrier region 503 is the lower layer 507. The lower layer may be undoped GaAs or InP for example.

A quantum dot layer comprising a plurality of quantum dots including the quantum dot 509 is at an interface between the lower layer 507 and an upper layer 511. The upper layer may be GaAs or InP for example. The quantum dots 509 may be InAs quantum dots for example.

Overlying and in contact with the upper layer 511 is an upper barrier layer 504, which may comprise AlGaAs or InAlAs for example. Overlaying and in contact with the upper barrier layer 504 is a p-type contact layer 513. In one embodiment, the p-type contact layer 513 is a heavily p-doped layer of GaAs or InP.

There is a gap between the first region 5 and a second region 7 which is etched through the layers to the substrate during fabrication of the structure.

A n-type contact 521 is contacted to the lower doped contact region 502. In an embodiment where the substrate 501 is also n-doped, the n-type contact 521 could alternatively be located on the opposite surface to the first surface of the substrate 501. A first p-type contact 519 is contacted to the p-type contact layer, above the first region 5. A second p-type contact 517 is contacted to the p-type contact layer, above the second region 7.

Bragg mirror layers (not shown) may be included in the device. Bragg mirror layers (not shown) are formed using alternating higher and lower refractive index layers each of a quarter of the wavelength thick. The larger the number of layers, the higher reflectivity achieved. The greater the contrast in refractive index, also, the higher reflectivity is achieved. Alternating layers of epitaxially grown semiconductor material such as GaAs/AlGaAs layers may be used. Alternatively, dielectrics such as $SiO_2/TiO_2$ or $SiO_2/Si_3N_4$ layers may be used. Such dielectric Bragg mirrors (not shown) may be deposited by techniques including but not limited to sputtering, evaporation, or plasma-enhanced chemical vapour deposition.

The first region 5 and the second region 7 are laterally combined on the substrate 501. Light emitted from the first region 5 may be directed in the plane of the layers, i.e. in a direction perpendicular to the stacking direction of the layers, for example by waveguide layers, or by a continuous metal contact on top of the first region 5 and the semiconductor-air interface or further metal layer below the substrate. Light emitted from the second region 7 may also be directed in the in-plane direction, again by waveguide layers, or by a continuous metal contact on top of the first region 5 and the semiconductor-air interface or further metal layer below the substrate. However light may alternatively be emitted in the out of plane direction, by forming a gap in the p-type contact layer 513 and the second p-contact 517 such that light can be emitted in the out of plane direction, away from the substrate 501. If the top metal contact 519 is not continuous, it will not reflect all of the vertically emitted light back into the device, hence some light is emitted vertically.

The first region 5 and second region 7 are arranged relative a first plane, which is substantially parallel to the first surface of the substrate 501. Light is emitted from the first region 5 and the second region 7 and directed in the first plane. Light emitted from the first region impacts the second region and is absorbed in the second region 7.

The photon source shown in FIG. 5 can be grown by molecular beam epitaxy or metal organic vapour phase epitaxy (MOVPE) for example. The device can be grown using a monolithically integrated approach or alternatively the first region 5 and second region 7 can be fabricated in isolation and subsequently brought together on a shared platform by some post-fabrication assembly process such as flip-chip bonding.

As described above, the device may be GaAs based or InP based for example. InP substrates can be used for devices operating at telecom wavelengths, as its crystallographic structure allows emission at energies from telecom bands.

In one embodiment, the individual components are grown on one type of substrate and then bonded to a different type of substrate using a technique such as, but not limited to, flip-chip bonding.

In an embodiment, AuGeNi may be used as an n-type contact metal and the p-contact metal may be any one of PdZnAu, AuCrAuZnAu or AuBe. An n-type electrode is formed comprising the n-contact 521, a first p-type electrode is formed comprising the first p-contact 519 and a second p-type electrode is formed comprising the second p-contact 517. The first voltage source V1 is connected across the first p-contact 519 and the n-contact 521. The second voltage source V2 is connected across the second p-contact 517 and the n-contact 521.

The gap between the first region 5 and the second region 7 can be achieved by wet or dry etching. For GaAs and InP-based devices, this can be achieved using a Chlorine-based chemistry, at high temperature in the case of InP. InP can also be dry-etched using methane-based process. Alternatively the gap may be produced using standard wet chemical etches.

Various lateral shapes of the first region 5 and the second region 7 can be formed by etching, for example rectangular or square cross-section.

Thus the first region 5 and/or second region 7 may comprise a cavity. The optical cavity may be formed by the inclusion of alternating layers of high and low refractive index, each of thickness $\lambda/4$, providing confinement in the out of plane direction. Confinement in the in-plane direction may be provide by grating, photonic crystal structures, etching or partial oxidation of layers.

The gap between the first region 5 and the second region 7 can alternatively be filled with an undoped material similar index of refraction, after the trenches are etched.

Figure 9:
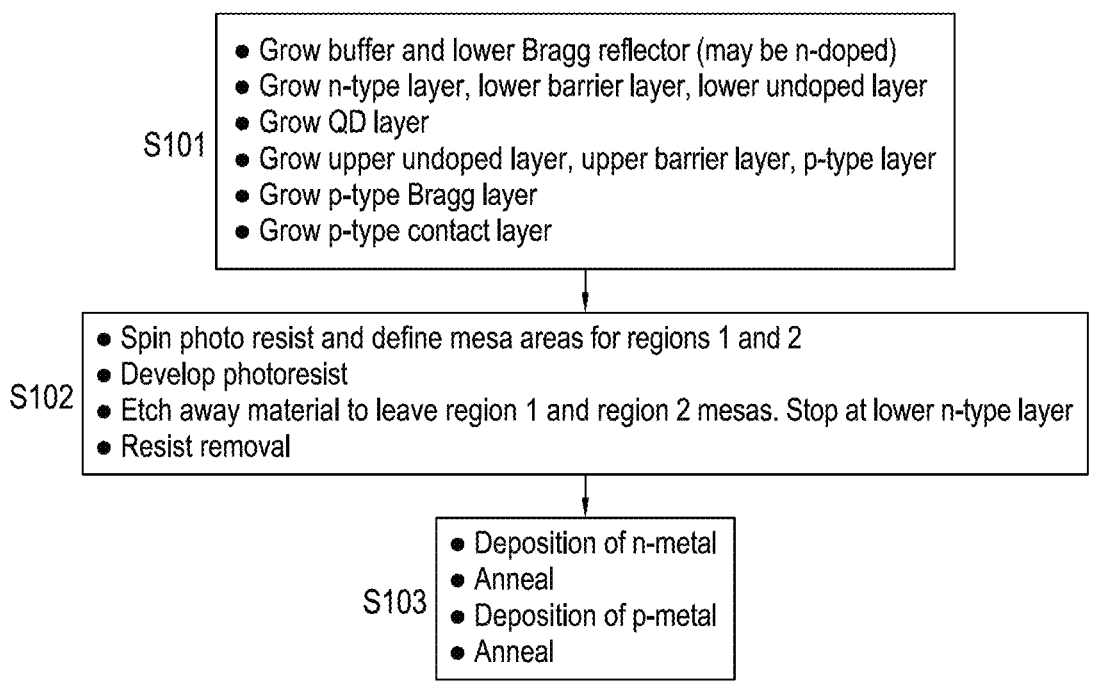
FIG. 9 is a flow chart of a method of growth and fabrication of the semiconductor structure of a photon source in accordance with an embodiment.

FIG. 9 is a flow chart of a method of growth and fabrication of the semiconductor heterostructure of a photon source 1 in accordance with an embodiment. The method can be used to fabricate the heterostructure shown in FIG. 8 for example.

In devices fabricated by this method, both first region 5 and the second region 7 are integrated monolithically on a substrate. In an embodiment, the substrate is an n-type GaAs or InP substrate.

In step S101, a buffer layer is grown on a substrate 501, followed by a lower epitaxial Bragg mirror 505. This mirror may be partly or entirely n-doped. Overlying and in contact with the lower Bragg mirror 505 is the n-type layer 502, the lower barrier layer 503, the lower undoped layer 507, quantum dot layer 509, upper layer 511, upper barrier layer 504, p-type layer 513 and upper Bragg mirror 506. To form the quantum dot layer 509 more than 1.7 monolayers of InAs sources may be deposited on the lower layer 507 for example. This then "self-assembles" into quantum dots.

In step S102, the device is first removed m the growth machine. A photo resist is then spun on the dielectric layer, and the first region 5 and second region 7 having the desired shape and, with a gap between are defined in the photo resist by optical lithography. After development, the strip defined in the resist is transferred to the semiconductor structure by wet etching in an acid; peroxide:water solution down into at least the lower n-doped region 502 if not deeper. For GaAs/AlGaAs structures, the solution may be a $H_2SO_4$: $H_2O_2$:$H_2O$ solution. The device is rinsed in de-ionised water and the photoresist removed for example in a solvent such as acetone, a proprietary resist remover solution or by $O_2$ plasma ashing.

Alternatively the above etching step could be achieved using a dry etch process, either with the same photoresist mask or a dielectric mask if increased selectivity is required.

Step S103 involves definition of contact areas with optical lithography, depositions of n and p metal contacts and annealing. The p metal contacts are deposited on the p-type contact layer 513. If the lower Bragg mirror 505 and substrate 501 are n-doped, the n metal contact may be deposited on the opposite surface of the substrate 501 to the first surface. Otherwise the metal contact is made to a n-type surface exposed during the etch process in step S102.

Figure 10:
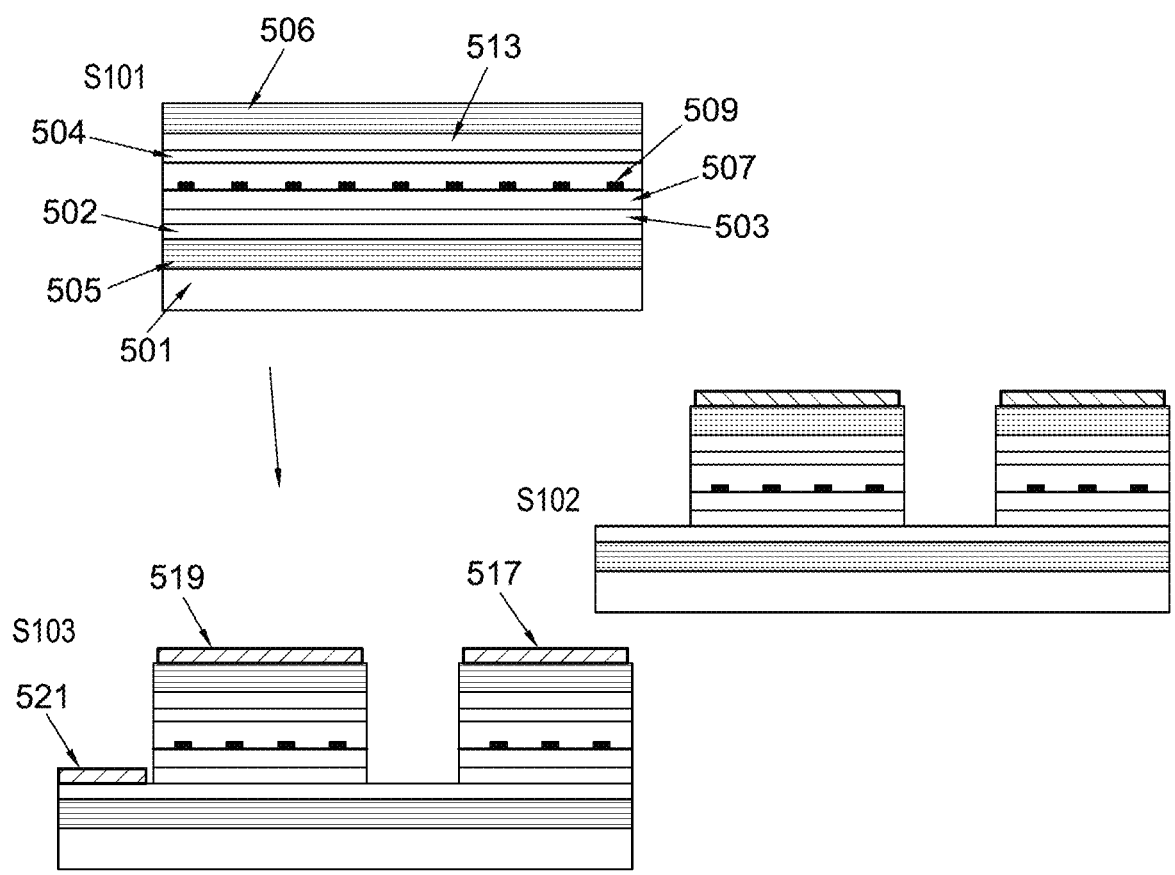
FIG. 10 shows the structure of the sample after each of the steps of FIG. 9.

FIG. 10 shows the structure of the sample after each of the steps of FIG. 9.

After step S101, the sample comprises a substrate 501 with a buffer layer, lower Bragg Mirror 505 overlying and in contact with the buffer layer, n-type layer 502 overlying and in contact with the lower Bragg mirror 505, a lower barrier layer 603 overlying and in contact with lower n-type layer lower i-layer 507 overlying and in contact with lower barrier 503, a quantum dot layer 509 overlying and in contact with the lower i-layer 507, a upper i-layer 511 overlying and in contact with the quantum dot layer 509, an upper barrier 504 overlying and in contact with the upper i-layer 511, an upper p-layer 513 overlying and in contact with the upper barrier 504 and an upper Bragg mirror 506, which may be p-doped, overlying and in contact with the upper p-layer 513.

After step S102, the first photoresist mask, upper Bragg mirror 506, p layer 513, upper barrier 504, upper i-layer 511, quantum dot layer 509, lower i-layer 507 and lower barrier 503 form two ridges, defining the first region 5 and the second region 7.

After step S103, a first p-contact 519 and a second p-contact 517 are overlying and in contact with the p-doped upper Bragg mirror 506. An n-contact metal 521 is in contact with the n-type layer 502.

In an alternative embodiment, regions 5 and 7 are linked by a waveguiding region to more efficiently transfer photons between the two elements. This waveguiding region is formed during the fabrication process, either by re-growth e.g. of III-V materials or evaporation/sputtering etc, of dielectrics for example.

Figure 11:
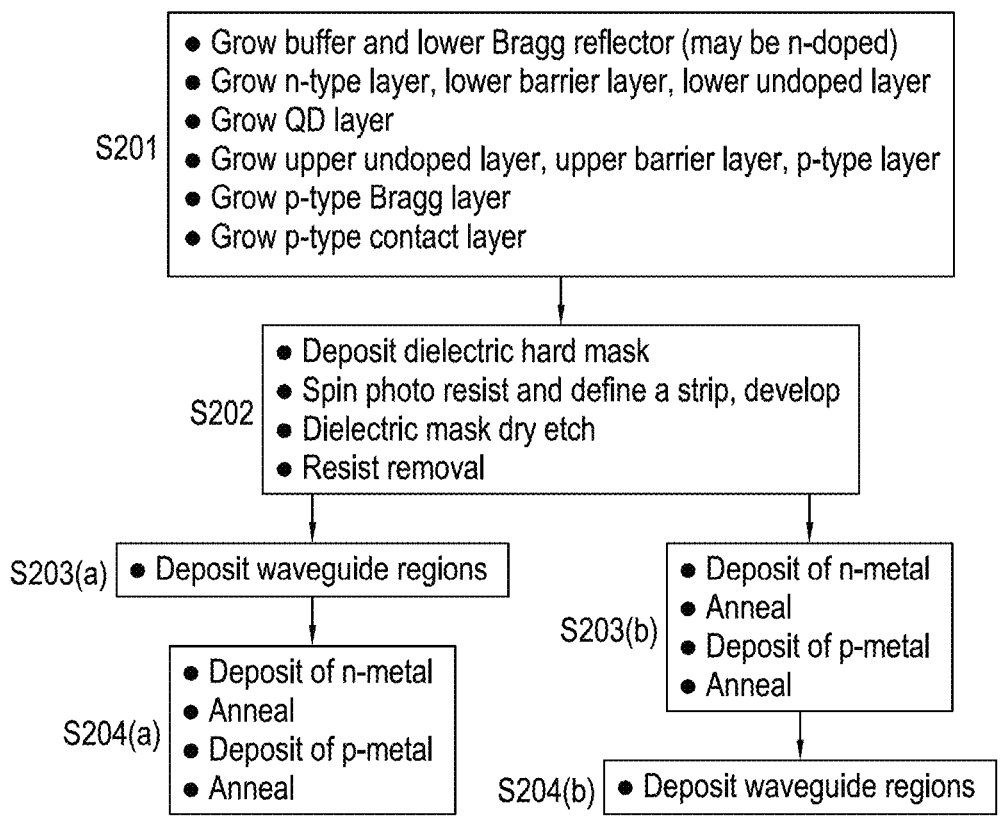
FIG. 11 shows a flow chart of a method of growth and fabrication of a semiconductor structure in accordance with an embodiment.

FIG. 11 shows a flow chart of a method of growth and fabrication of a semiconductor heterostructure in accordance with an embodiment. The method can be used to fabricate a heterostructure comprising, a waveguide region between the first region 5 and the second region 7 such as shown in FIG. 12.

Figure 12:
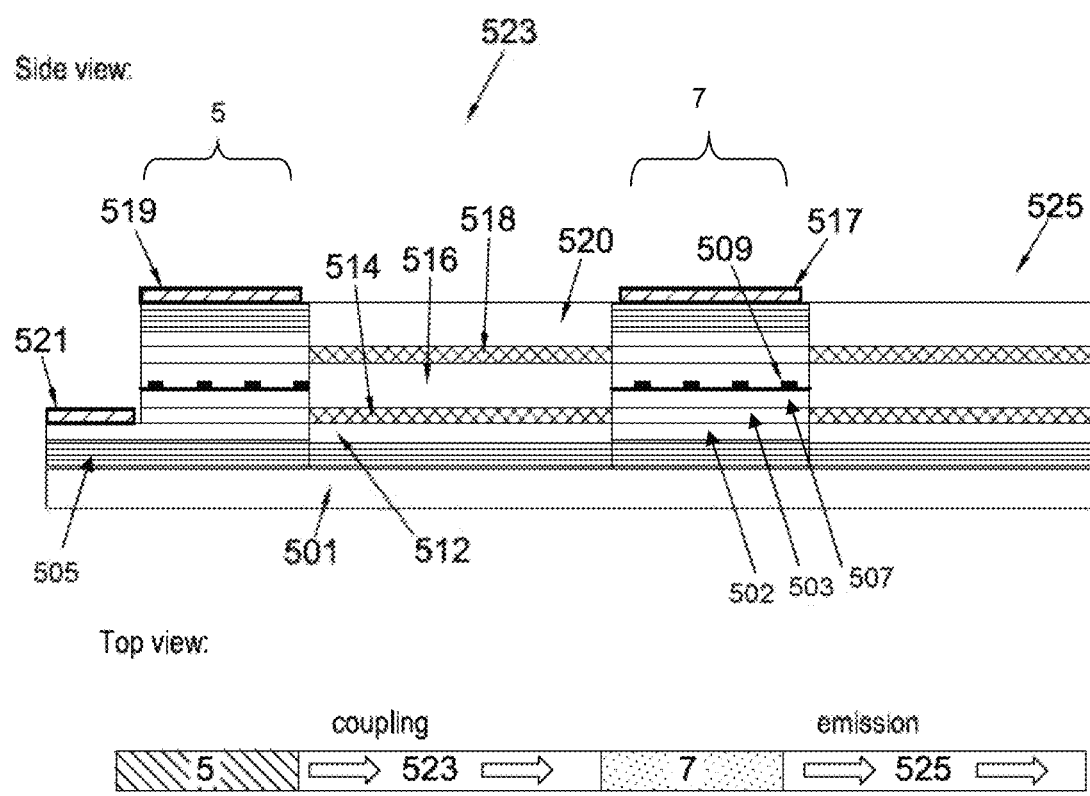
FIG. 12 shows a schematic illustration of a semiconductor structure which is part of a photon source in accordance with an embodiment.

A structure such as shown in FIG. 12 can be grown by MOVPE for example. MOVPE is suitable due to the multiple overgrowth steps in the process.

In step S201, a buffer layer is grown on a substrate 501, followed by a lower epitaxial Bragg mirror 505 of the type described above. This mirror may be partly or entirely n-doped. Overlying and in contact with the lower Bragg mirror is the n-type layer 502, lower barrier layer 503, lower undoped layer 507, quantum dot layer 509, upper layer 511, upper barrier layer 504, p-type layer 513 and upper p-type DBR 506.

In step S202, the sample is then taken out of the growth machine. This step comprises deposition of a dielectric hard mask, which could be a $Si_3N_4$ or $SiO_2$ layer for example. The thickness of this dielectric layer May be dependent on the thickness of the active area grown and the dry etch selectivity. Next a photo resist is spun and a strip is defined by optical lithography. After development, the strip pattern defined in the resist is transferred to the dielectric layer through dry etching using fluorine based chemistry for example. Next, the remaining resist on the surface is removed in a resist remover solution or by $O_2$ plasma ashing. Next, a semiconductor dry etch is carried out, $Cl_2$ based chemistry may be used to provide good quality vertical sidewalls. In this stage, trenches are formed, by selectively removing the layers by etching. The etch is performed down to the substrate 501 or the lower Bragg mirror 505 depending on device design. The latter case is shown in FIG. 12.

The sample is then ready for step S203a. The dielectric hard mask is left on. This will prevent local overgrowth on top of the first region 5 and the second region 7, in this step, the first waveguide region 523 and the second waveguide region 525 are grown, followed by planarization. The waveguide regions are grown in the pre-defined trenches formed in step S202.

Growing the waveguide regions may comprise growing a first layer 512 overlying and in contact with the substrate 501. The first layer may be undoped InP or GaAs for example. Next, a first cladding layer 514 is grown overlying and in contact with the first layer 512. The first cladding layer 514 may be InAlAs for example. A core layer 516 is grown overlying and in contact with the first cladding layer 514. The core layer 516 may be InGaAs for example. A second cladding layer 518 is grown overlying and in contact with the core layer 516. The second cladding layer may be InAlAs. A second layer 520 is formed overlying and in contact with the second cladding layer 518. The second layer 520 may be InP or GaAs for example. The first cladding layer 514, core region 516 and second cladding layer 518 form a waveguide. In use, light is confined in the out of plane direction by the cladding layers. Light is confined in the in-plane direction by the etched edges of the waveguide region or by lateral oxidation of the layers for example.

In step S204a, the dielectric hard mask is removed. This involves dipping the sample in HF or dry etching. Next, fabrication is carried out, which involves spinning the optical resist and defining the n-contact. After development of the resist the n-metal is deposited and lifted off and annealed. A similar procedure is applied to define the p-contacts.

In an alternative embodiment, shown in steps S201, S202, S203b and S204b, the contacts may be deposited and annealed prior to the growth of the waveguide regions. Consideration may be taken of the thermal budget available for the particular selection of waveguide and contact materials when choosing the order of these steps.

FIG. 12 shows a schematic illustration of semiconductor heterostructure of a photon device in accordance with an embodiment. The figure shows a side view along the length of the device, i.e. along the direction along which light is emitted, and a top view.

A first waveguide region 523 is used to guide electroluminescence from the first region 5 to the second region 7. A second waveguide region 525 is used to guide light emitted from the second region 7.

There is a waveguide region 523 between the first region 5 and the second region 7. There is a second waveguide region 525 positioned on the opposite side of the second region 7 to the first waveguide region 523. Light travels between the first region 5 and the second region 7 though the first waveguide region 523.

The waveguide regions comprise a first layer 512 overlying and in contact with the buffer layer, a waveguide overlying and in contact with the first layer 512 and a second layer 520 overlying and in contact with the waveguide. Light is confined vertically and laterally in the waveguide. The first layer 512 and second layer 520 may be InP of GaAs for example. The waveguide may comprise art InGaAs core layer 516 with InAlAs cladding regions above and below.

Light emitted from the first region 5 enters waveguide region 523 an through the waveguide region to the Light emitted from the second region 7 enters the waveguide region 522.

The first region 5 and the second region are active regions. The first waveguide region 523 and the second waveguide region 525 are passive regions. The first region 5, second region 7, first waveguide region 523 and second waveguide region 525 are electrically isolated from each other. The first region 5 and the second region 7 have separate electrical p-contact regions 517 to allow them to be independently biased. They may share a single n-contact region 521 or there may be separate n-contacts.

In an alternative embodiment, instead of etching through the structure down to the substrate, a trench may be partially etched down to the upper barrier layer 504 or upper i-layer 511. This allows the first and second regions, 5 and 7, and the waveguiding regions 523, 525 to be formed entirely monolithically from the original epitaxial layers.

Figure 13:
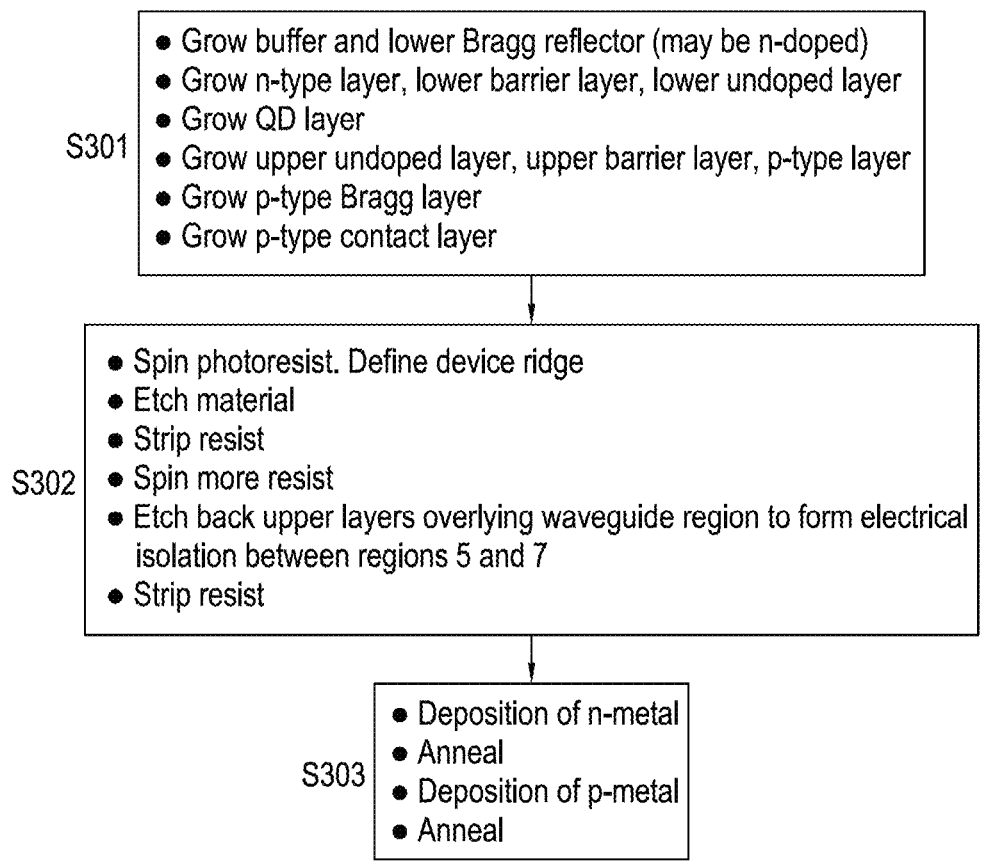
FIG. 13 shows a flow chart of a method of growth and fabrication of conductor structure of a photon source in accordance with an embodiment.
Figure 14:
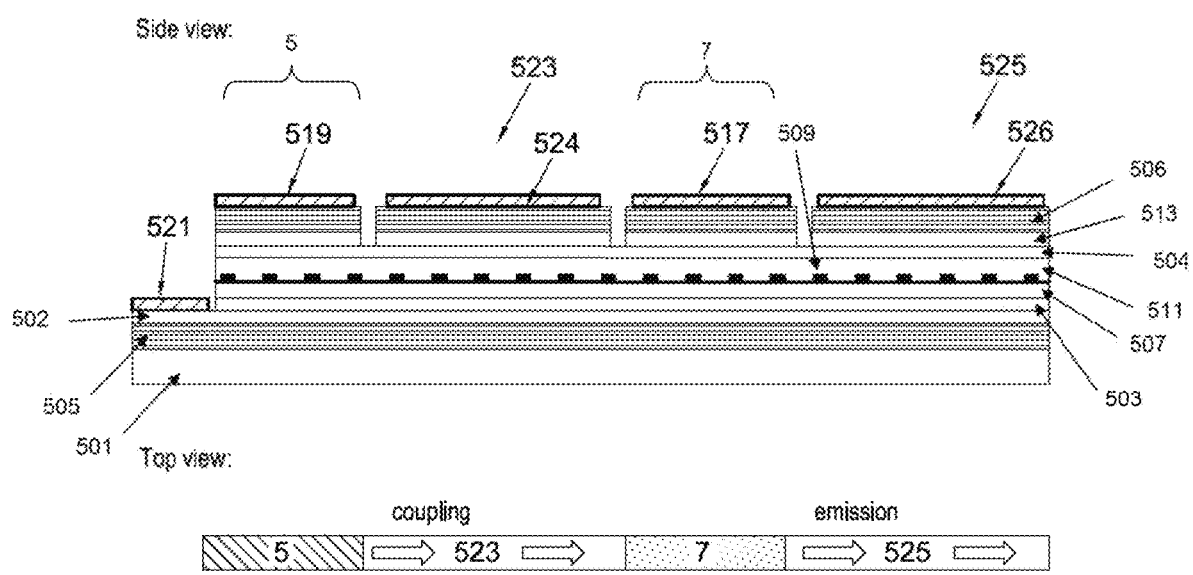
FIG. 14 shows a schematic illustration of a semiconductor structure which is part of a photon source in accordance with an embodiment.
Figure 15:
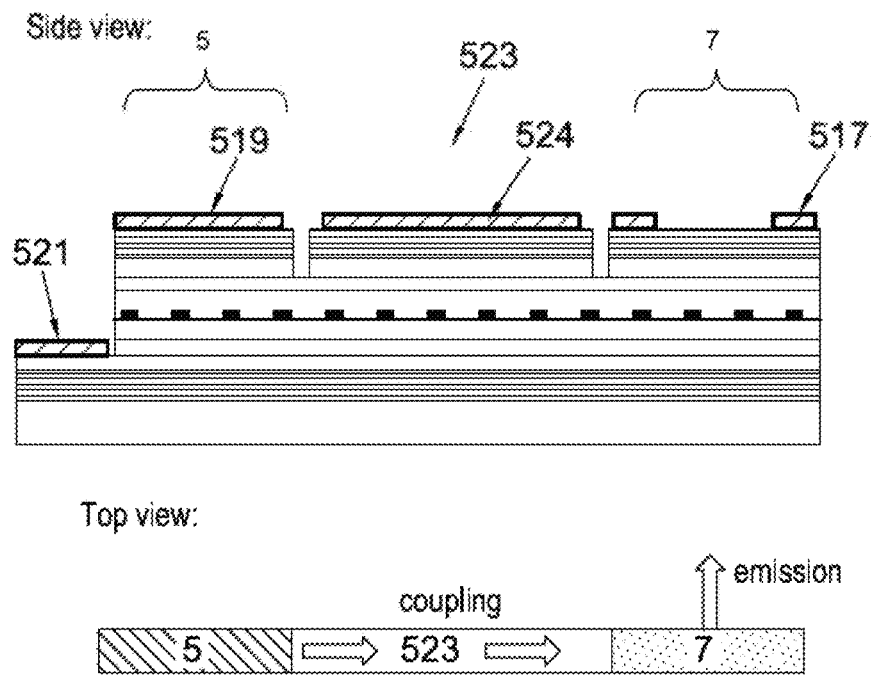
FIG. 15 shows a schematic illustration of a semiconductor structure which is a part of a photon source in accordance with an embodiment.

FIG. 13 shows a flow chart of a method of growth and fabrication of semiconductor heterostructure of a photon source in accordance with an embodiment. The method can be used to fabricate a heterostructure comprising a monolithically integrated waveguide region between the first region 5 and the second region 7 such as shown in FIG. 14, wherein the photons emitted from the second region 7 are guided away in the plane perpendicular to the growth direction. FIG. 15 shows an alternative embodiment in which the photons emitted from the second region 7 are directed away in a direction parallel to the growth direction.

In step S301, a buffer layer is grown on a substrate 501, followed by a lower epitaxial Bragg mirror 505 of the type described above. This mirror may be partly or entirely n-doped. Overlying and in contact with the lower Bragg, mirror 505 is the n-type layer 602, lower barrier layer 503, lower undoped layer 507, quantum dot layer 509, upper layer 511, upper barrier layer 504, p-type layer 513 and upper p-type DBR 506.

In step S302, the sample is then taken out of the growth machine. Masking material is deposited and patterned to define the main device. In this example photoresist alone is used as the masking material, but a dielectric hard mask could equally be employed as previously described. After exposure and development of the photoresist, the main device layout is transferred into the semiconductor by wet or dry etching. The etch may be performed down to the substrate 501, the n-type Bragg mirror 505 or the n-doped layer 502. This step forms a ridge or mesa structure along the substrate.

The resist is removed and a second layer of photoresist is coated onto the sample. Again, a dielectric hard mask could alternatively be employed at this stage. The photoresist is exposed and developed to define trenches between the first region 6, coupling waveguide region 523, second region 7 and emission waveguide region 525 if present. The pattern is transferred by wet or dry etching. The etch is performed down to the upper barrier layer 504 or just into the upper i-layer 511 for example.

The mask material is then removed.

In step S303, photo resist is spun, exposed and developed to define the n-type metal contact 521. Metal is evaporated and lift-off is performed. The contact is annealed. A similar procedure is performed to produce the p-type metal contacts 519 and 517.

FIG. 14 shows a schematic illustration of semiconductor heterostructure of a photon device in accordance with an embodiment, which may be fabricated by the fabrication steps detailed in FIG. 13. The figure shows a side view along the length of the device, i.e. along the direction along which light is emitted, and a top view.

Here the device is configured such that photons emitted from the second region 7 are coupled out of the device through a waveguide 525 perpendicular to the growth direction, i.e. in the plane of the layers. The device comprises a monolithic integrated waveguide.

A first waveguide region 523 is used to guide electroluminescence from the first region 5 to the second region 7. A second waveguide region 525 is used to guide fight emitted from the second region 7.

The first waveguide region 523 is, between the first region 5 and the second region 7. The second waveguide region 525 is positioned on the opposite side of the second region 7 to the first waveguide region 523. Light travels between the first region 5 and the second region 7 though the first waveguide region 523.

The waveguide regions 523 and 525 comprise the same layers as the first region 5 and the second region 7. A contact 524 is overlying and in contact with the first waveguide region 523 and a contact 526 is overlying and in contact with the second waveguide region 525. The waveguide regions 523 and 525 are defined by gaps which are etched between regions. The gaps are etched down to the upper barrier layer 504 or to just into the upper i-layer 511 for example. Light is confined vertically and laterally in the waveguide. Light emitted from the first region 5 enters the waveguide region 523 and travels through the waveguide region to the second region 7. Light emitted from the second region 7 enters the waveguide region 525.

A forward bias is applied to the first region 5 in order to electrically pump the first region 5. Strong reverse bias coupling and emission regions can be included to suppress emission. Applying a bias to contact 524 and/or 526 could be used to prevent spurious emission from any QDs in the waveguiding regions. If carriers are absorbed in 523 or 525, they could recombine and populate and QDs in those regions. By applying a very strong negative bias here, any carriers would be swept out of the QDs before they could recombine this preventing QD emission from occurring.

Alternatively, the device can be configured such that the emission from the second region 7 is directed out of the device in the direction parallel to the growth direction. An example of such a device is shown in FIG. 15.

FIG. 15 shows a schematic illustration of semiconductor heterostructure of a photon device in accordance with another embodiment following the fabrication steps detailed in FIG. 13. The figure shows a side view along the length of the device, i.e. along the direction along which light is emitted, and a top view.

Here the photon source is configured such that photons emitted from the second region 7 are coupled out parallel to the growth direction. The device comprises a monolithic integrated waveguide.

A first waveguide region 523 is used to guide electroluminescence from the first region 5 to the second region 7 in the in-plane direction. The first waveguide region 523 is between the first region 5 and the second region 7. Light travels between the first region 5 and the second region 7 in the in-plane direction though the first waveguide region 523.

The first waveguide region 523 comprises the same layers as the first region 5 and the second region 7 and is defined by gaps which are etched between the regions. A contact 524 is overlying and in contact with the first waveguide region 523. The gaps are etched down to the upper barrier layer 504 or to just into the upper i-layer 511 for example. Light is confined vertically and laterally in the first waveguide region 523. Light emitted from the first region 5 enters the waveguide region 523 and travels through the waveguide region to the second region 7.

Light emitted from the second region 7 is emitted in the out of plane direction. A gap is formed in the p-contact 517 which is overlying the second region 7. Light is emitted through this gap from the second region 7.

A forward bias is applied to the first region 5 in order to electrically pump the first region 5. Strong reverse bias coupling and emission regions to suppress emission can be included as above.

Figure 16:
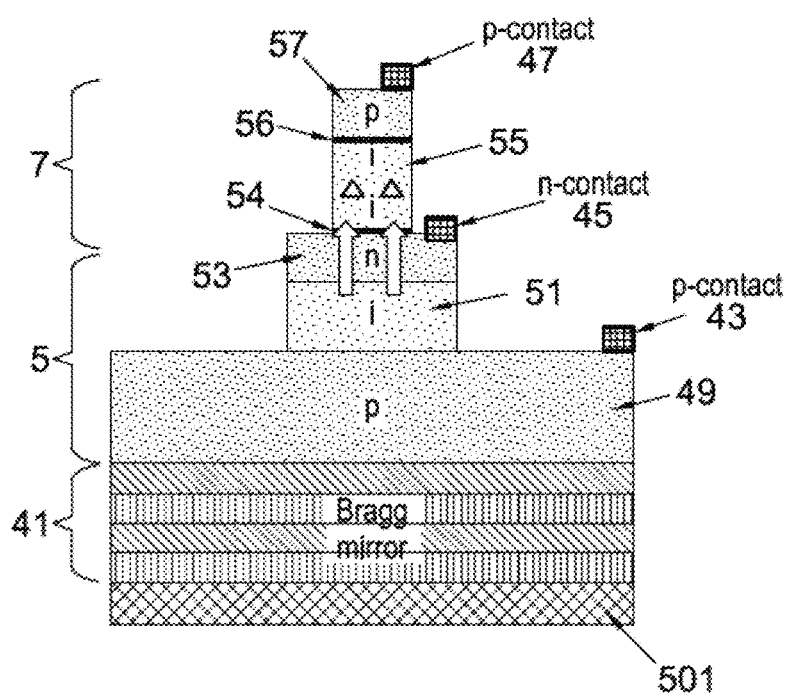
FIG. 16 shows a schematic illustration of a semiconductor structure which part of a photon source in accordance with an embodiment.

In an alternative embodiment, the first region 5 is positioned overlying or underlying the second region 7. The first region 5 may be in contact with the second region 7, or a waveguide region may be provided between the first region 5 and the second region 7. FIG. 16 shows a schematic illustration of a semiconductor heterostructure which is part of a photon source 1 in accordance with an embodiment. Light is emitted from the first region 5 and the second region 7 in a direction out of the plane of the layers, i.e. in a direction parallel to the stacking direction of the layers.

The voltage applied to the first region 5 drives the first region 5 to, emit photons, which optically pump the second region 7. The first region 5 and the second region 7 are aligned vertically, i.e. in the growth direction, or out of plane direction of the layers.

The first region 5 and the second region 7 are integrated onto a first surface of the substrate 501. The first region 5 and the second region 7 are arranged relative to each other in a second plane which is substantially perpendicular to the first surface of the substrate 501. Light is emitted from the first region 5 and the second region 7 in the second plane. The first region 5 and the second region 7 are configured such that light emitted from the first region 5 impacts the second region 7 and is absorbed in the second region 7. The second region 7 is stacked on top of the first region 5, in other words, the first region 5 is between the second region 7 and the substrate 501.

A structure such as shown in FIG. 16 can be grown by MBE or MOVPE for example.

In one embodiment, the substrate is IP or GaAs.

One or more electrical contacts may be formed to the first region 5 and the second region 7. AuGeNi or PdGe may be used as an n-type contact metal a p-contact metal may be any one of PdZnAu, AuCrAuZnAu or AuBe for example.

Dry etching of GaAs and InP can be achieved using a Chlorine-based chemistry, at high temperature in the case of InP. InP can also be dry-etched using a methane-based process. Standard wet chemical etches may be used. A dielectric hard mask, formed using $Si_3N_4$ or $SiO_2$ may be used. Further details of me methods of device fabrication are described below.

Various lateral shapes can be formed. The cross-section of the first region 5 and the second region 7 may be circular for example.

The first region 5 and/or second region 7 may comprise an optical cavity. Alternating layers of high and low refractive index, each of thickness $\lambda/4$ may provide confinement in the out of plane direction. Confinement in the in-plane direction may be provided by grating, photonic crystal structures, etching or partial oxidation of layers.

The device may further comprise oxide apertures to confine the current path and optical modes in the first region 5 and/or the second region 7.

The structure comprises a substrate 501, a Bragg, mirror layer 41 overlying and in contact with the substrate 501, a first p-layer 49 overlying and in contact with the Bragg mirror layer 41, a first un-doped layer 51, overlying and in contact with the first p-layer 49, an n-layer 53, overlying and in contact with first un-doped layer 51, a first barrier layer 54 overlying and in contact with the n-layer 53, a second un-doped layer 55 comprising at least one quantum dot overlying and in contact with the first barrier layer 54, a second barrier layer 56 overlying and in contact with the second un-doped layer 55 and a second p layer 57, overlying and in contact with the second barrier layer 56.

There is p-metal contact 47 in contact with the first p-layer 57. An n-metal contact 45 is in contact with the surface of the n-layer 53 at the side of the ridge. The structure has a "stepped" shape, with the substrate 501, Bragg mirror 41 and first p-layer 49 forming a first "step", the first un-doped layer 51 and the n-layer 53 forming a second "step", and the first barrier layer 54, second un-doped layer 55, second barrier layer 56 and second p-layer 57 forming a third "step". A p-metal contact 43 is in contact with the surface of the first p-layer 49 at the side of the step.

A current is applied between the bottom p-contact 43 and the n-contact 45 in order to generate light at the first region 5. Light generated in the first region 5 is emitted in the stacking direction of the layer& thorough the n-layer 53. The light enters the second region 7.

FIG. 17 shows a flow chart of method of growth and fabrication of a semiconductor heterostructure which is part of a photon source 1 in accordance with an embodiment.

The device is monolithically grown in step S401. The growth phase, step S401 completed before any fabrication starts in step S402.

In an embodiment, the substrate 501 is InP or GaAs. The substrate 501 may be overgrown with a buffer layer. A Bragg mirror layer 41, which is a distributed Bragg reflector (DBR), is then grown. The Bragg mirror layer 41 comprises multiple layers of alternating materials with varying refractive index. The materials may be GaAs/AlGaAs, InP/AlInGaAs, InP/InGaAsP or AlInGaAs/AlInAs, the latter three all being lattice matched to InP for example. As the Bragg mirror layer 41 is located at the "bottom" of the device, i.e. closest to the substrate 501, in one embodiment it is configured to have greater than 95% reflectivity, meaning that light is reflected from the first region 5 away from the substrate 501 and towards the second region 7. A first p-layer 49 is then grown, followed by a first un-doped layer. An n-type layer 53 is then grown, followed by first barrier layer 54, a second un-doped layer 55 comprising at least, one quantum dot, a second barrier layer 56 and a second p-layer 57. The first p-layer 49, first un-doped layer 51, n-layer 53, second un-doped layer 55 and, second p-layer 57 may be GaAs or InP for example. The first and second barrier layers 54 and 56 are higher band gap materials which may for example AlGaAs, InAlAs, InAsP, InAlAsP. The second un-doped layer 55 may comprise an InAs quantum dot layer for example.

The fabrication step S402 starts with the resist, being spun on top of the wafer to define optically the top p-type contact 47. After resist development, p-metal is deposited and lifted off. The top p-contact 47 is deposited on the second p-layer 57.

Then a dielectric layer is deposited, which can be a $Si_3N_4$ or $SiO_2$ layer for example. This layer acts as a hard mask for etching. Next, an optical resist is spun to define the top shape/size of the device. After development the hard mask is etched based on $CHF_3$ or $CF_4$ chemistry for example. The remaining resist is then removed, in resist remover solution for example. The semiconductor wafer is then etched down to the n-layer 53. The etching may be based on $Cl_2$-chemistry. The dielectric mask is then removed by HF for example.

An optical resist is then spun, and an n-type contact area is defined and developed. Next the n-metal is deposited. The n-contact 45 is deposited on the etched surface of the n layer 53.

Next, another dielectric layer is deposited, which could be a $Si_3N_4$ or $SiO_2$ layer for example. The dielectric layer acts as a hard mask for etching. The optical resist is spun and the bottom level shape is defined. After development the dielectric mask is dry etched followed by a semiconductor etch down to the first p-layer 49. The dielectric hard mask is then removed. This etch is performed to create a flat surface to make an act to the first p-layer 49.

Another resist is then spun on top of the wafer to define optically the bottom p-type contact 43. After resist development, p-metal is deposited and lifted off. The bottom p-contact 43 is on the first p-layer 49.

Figure 18:
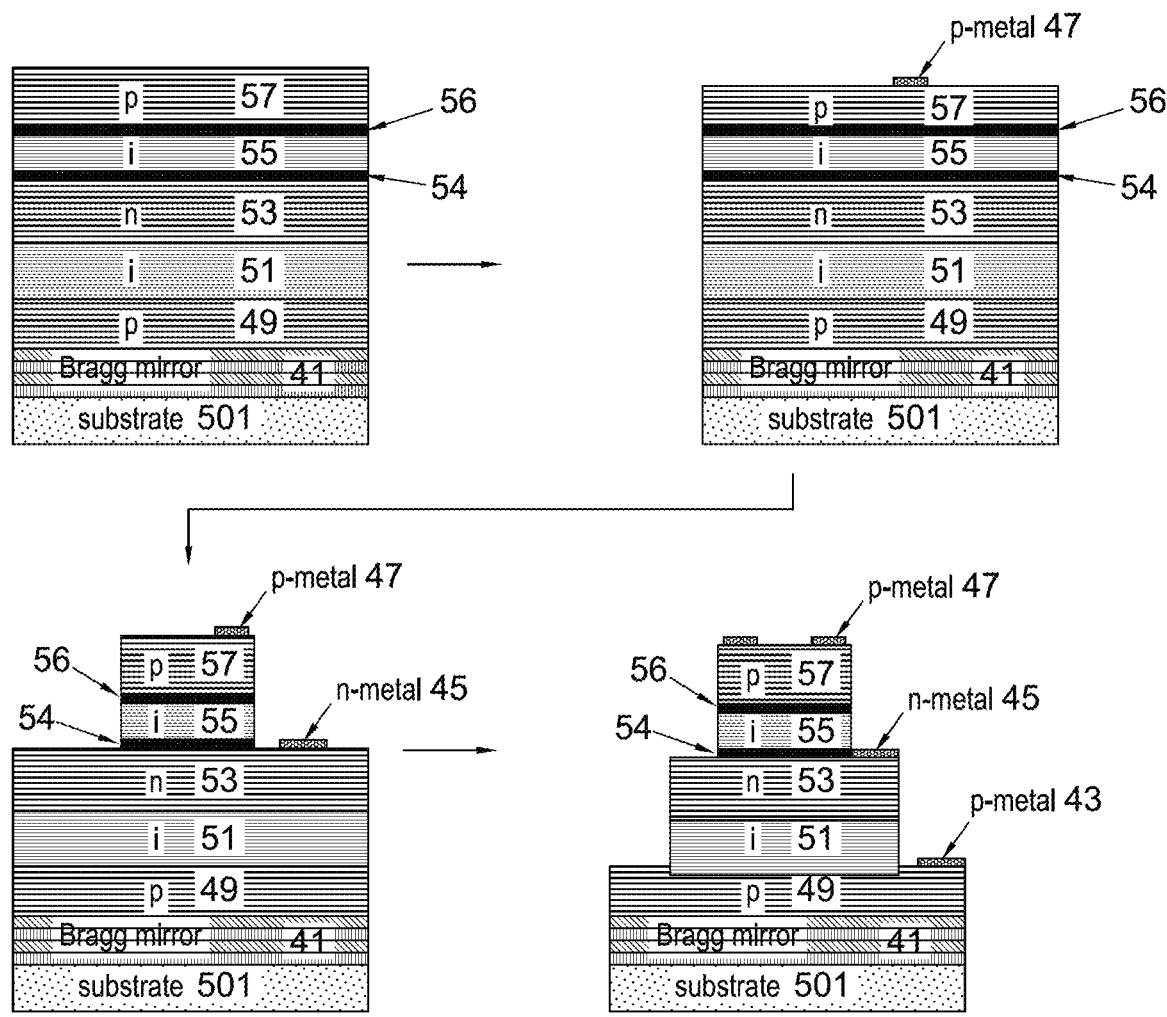
FIG. 18 shows the structure of the sample after each of the steps of FIG. 17.

FIG. 18 shows the structure of the sample after each of the steps of FIG. 17.

Figure 19:
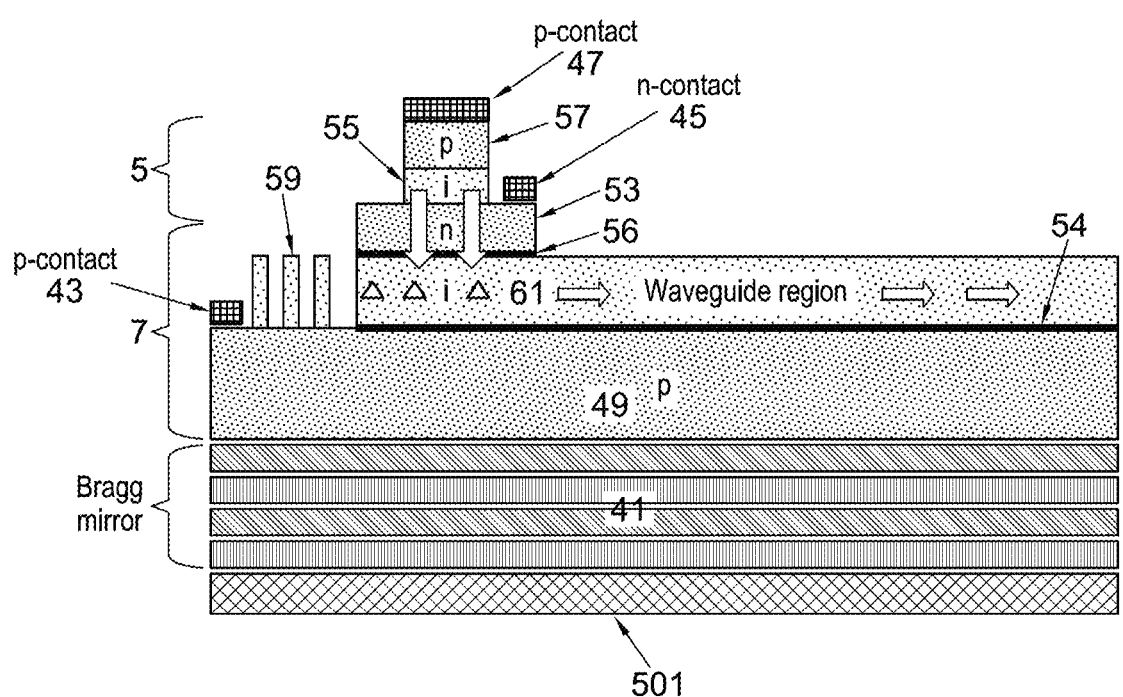
FIG. 19 shows a schematic illustration of a semiconductor structure which is part of a photon sound in accordance with an embodiment, in which the first region and the second region are n a vertical junction and in a vertical combination.

FIG. 19 shows a schematic illustration of a semiconductor heterostructure which is part of a photon source 1 in accordance with an embodiment, in which the first region 5 and the second region 7 are in a vertical junction and in a vertical combination. The figure shows a cross-section through the layers.

The at least one quantum dot in the second region 7 is embedded in a layer 61 which comprises a waveguide region. The first region 5 is integrated above the second region 7, i.e. such that the second region 7 is between the first region 5 and the substrate 501. However it could alternatively be integrated below the second region 7 such that the first region 5 is between the second region 7 and the substrate 501. The structure may comprise a grating etched into the layer 61 at one lateral edge, forming a DBR to reflect light along the waveguide region in one direction and out of the second region 7 in the in-plane direction.

The device comprises a substrate 501, a Bragg mirror layer 41 overlying and in contact with the substrate 501, first p-layer 49 overlying and in contact with the Bragg mirror layer 41, a first barrier layer 54 overlying and in contact with the first p-layer 49, a layer 61, overlying and in contact with the first barrier layer 54, a second barrier layer 56, overlying and in contact with the layer 61, an n-layer 53 overlying contact with the second barrier layer 56, an un-doped layer 55 overlying and in contact with the n-layer 53, and a second p-layer 57 overlying and in contact with the un-doped layer 55. The substrate may be InP or GaAs, as described above.

There is a p-metal contact 47 overlying and in contact with the p-layer 57. The structure has a "stepped" shape, with the substrate 501, Bragg mirror layer 41, first p-layer 49, louver barrier layer 54 and layer 61 forming a first "step", the upper barrier layer 56 and n-layer 53 forming a second "step", and the un-doped layer 55 and second p-layer 5, forming a third "step". A p contact is formed to the surface of the second p-layer 57 and to the first p-layer 49, for example in a gap etched through the waveguide layer 61. An n-metal contact 45 is in contact with the surface of the n-layer 53 at the side of the step.

One or more quantum dote are embedded in a portion of the layer 51 which is located beneath the first region 5. The layer 61 comprises a waveguide region. The light emitted from the quantum dots is directed along the waveguide region in the in-plane direction.

A current is applied between the top p-contact 47 and the n-contact 45 in order to generate light in the first region 5. Light generated in the first region 5 is emitted in the stacking direction of the layers, thorough the n-layer 53 towards the substrate. The light enters the second region 7. Light emitted from the quantum dot in the second region 7 is emitted in the plane of the layers, along the waveguide region in the layer 61.

Where the substrate is GaAs, the layer 61 may comprise GaAs or AlGaAs for example. If the substrate is InP, the layer 61 may be InP for example. The waveguide region may be a simple ridge of the single material, or may be a multi-layer waveguide with integrated lower-index cladding layers for example.

Thus the layer 61 may comprise the semiconductor material, for example GaAs or InP, grown above and below the quantum dots. The semiconductor material is etched to form the light emitting section of the second region 7, which is aligned with the first region 5, and to form the waveguide region, which is integrated with the light emitting section. Layers above and below the layer 61 may provide the confinement in the vertical direction. The dimensions of the waveguide region are such that it supports a single optical mode at the emission wavelength of the quantum dot. Alternatively, the waveguide region could be a separate structure which is deposited or re-grown as appropriate for the materials system during the fabrication process in a similar fashion to that described above in relation to FIG. 12. This could be achieved using a range of materials including, but not limited to combinations of dielectric materials, for example, $SiO_2$, SiOxNy, $Si_3N_4$, $TiO_2$, $V_2O_5$) and/or additional semiconductor materials such as GaAs, AlGaAs, InP.

FIG. 20(*a*) it is a schematic illustration of a plan view of a semiconductor heterostructure which is part of a photon source in accordance with an embodiment. The structure comprises a first region 5 and a plurality of second regions 7*a* to 7*d* laterally arranged on a substrate. The first region 5 is arranged centrally, between four second regions 7*a* to 7*d*, arranged at points of a cross. However, more or fewer second regions 7 may be provided. Furthermore, a plurality of first regions 5 may be provided on the same chip.

Light is emitted from the first region 5 and impacts each of the second regions 7*a* to 7*d*, thus the first region 5 emits light in all in-plane directions.

The structure is formed by etching a gap around the first region 5 and the second regions 7*a* to 7*d*. In an alternative embodiment waveguiding regions may be located between regions 5 and regions 7.

In this case, the first region 5 and second regions 7*a* to 7*d* are square shaped seen in the top view, but other shapes are possible. One of the second regions 7*a* to 7*d* is arranged on each side of the first region 5.

FIG. 20(*b*) is a schematic illustration of a plan view of a semiconductor heterostructure which is part of a photon source in accordance with an embodiment. The structure comprises a first region 5 which surrounds the second region 7 in a lateral direction. The second region 7 is a circular region seen in the plan, top, view. The first re ion is a ring shaped region which concentrically surrounds the second region 5. There is a gap between the first region 6 and the second region 7. The structure is formed by etching around the first region 5 and second region 7. In this arrangement, the outer edge of region 5 may be covered with a layer to reflect photons radiated outwards back toward region 7.

FIG. 20(*c*) is a schematic illustration of a plan view of semiconductor heterostructure which is part of a photon source in accordance with an embodiment. The structure is similar to that shown in FIG. 20(*b*), however the first region 5 is a U-shaped region. The first region 5 partly surrounds the second region 7.

FIG. 20(*d*) is a schematic illustration of a plan view of a semiconductor heterostructure which is part of a photon source in accordance with an embodiment. The structure comprises a first region 5 and a plurality of second regions 7 laterally arranged on a substrate. The first region 5 is arranged Centrally between and around four second regions 7. However, more or fewer second regions 7 may, be provided. The second regions 7 are arranged at four points arranged in a cross. The first region 5 comprises a U-shaped region partly surrounding each second region 7. The four U-shaped regions are combined in the region in the centre of the four second regions 7.

Figure 20A:
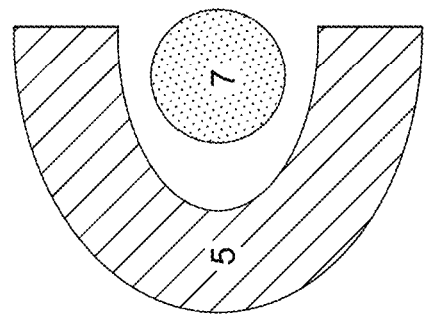
FIG. 20(a) is a schematic illustration of a plan view of a conductor structure which is part of a photon source in accordance with n embodiment.
Figure 20B:
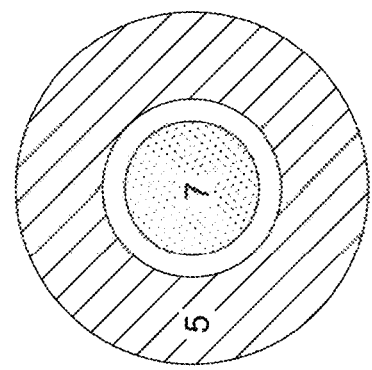
FIG. 20(b) is a schematic illustration of a plan view a semiconductor structure which is part of a photon source in accordance with an embodiment.
Figure 20C:
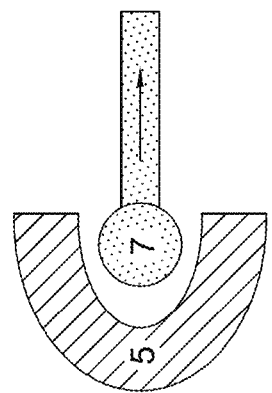
FIG. 20(c) is a schematic illustration of a plan view of a semiconductor heterostructure which is part of a photon source in accordance with an embodiment.
Figure 20D:
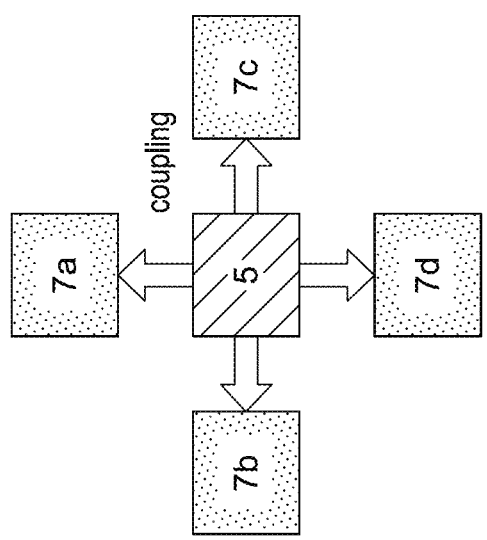
FIG. 20(d) is a schematic illustration of a plan view tor heterostructure which is part of a photon source in accordance with an embodiment.
Figure 20E:
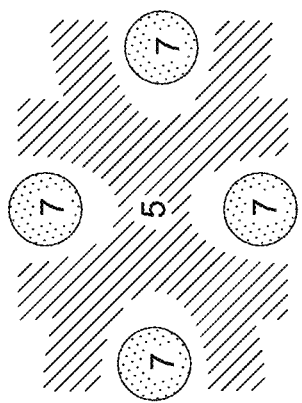
FIG. 20(e) is a schematic illustration of a plan view of a semiconductor heterostructure which is part of a photon source in accordance with an embodiment.

FIG. 20(e) schematic illustration of a plan view of a semiconductor heterostructure which is part of a photon source in accordance with an embodiment. The structure is similar to that shown in FIG. 20(c), however there is a waveguide region coupled to the second region 7, configured to direct light emitted from the second region 7 in the opposite direction to the location of the first region 5.

Generally, the second region 7 may be arranged at least partly around the first light emitting diode region 5, or the first light emitting diode region 5 may be arranged at least partly around the second region 7.

Other shapes and arrangements f the first region 5 and second region 7 are possible.

The arrangements shown in FIGS. 20(a) to (e) comprise simple PIN cavity structures. The second regions 7 may emit light in the in plane direction, away from the first region or in the out of plane direction for example, DBR layers may be included to enhance emission in the out of plane direction. The first regions 5 emit light in the in-plane direction. The first region 5 may comprise an opaque, metallic top layer to inhibit vertical emission, such that emission from the first region 5 is in the in plane direction only. The first region 7 may be optically coupled through free-space.

The arrangements shown in FIGS. 20(a) and (e) have multiple, independently tuneable quantum light sources, regions 7a-7d in this example, integrated onto a single substrate and which are all synchronised through the use of a single, on-chip, optical pump, comprising the first region 5. These devices have multitude of "daughter" second regions pumped by the "parent" first region.

The enclosed arrangements shown in FIGS. 20(b), 20(e) can be configured to direct more of the photons emitted by, the first region 5 towards the second region 7. The geometry is used to enhance the number of photons incident on the second region 7 for a given drive current. The partial enclosure geometry of arrangement 20(c) could itself be applied to a number of other configurations including the arrangements described above in relation to FIGS. 3 to 19 for example. The arrangement shown in FIG. 20(d) combines the partial-enclosure of the arrangement shown in FIG. 20(c) with the multiple second region 7 configuration of the arrangement shown in FIG. 20(a) The arrangement shown in FIG. 20(e) combines the partial-enclosure concept of the arrangement shown in FIG. 20(c) with a waveguide region coupled to the second region 7 to guide the photons away in-plane.

In an embodiment, the first region 5 and the second region 7 may be flip chip bonded onto the same substrate. The first region 5 may be formed on a first substrate for example. The second region 7 may be fabricated separately on a separate substrate. The first region 5 and second region 7 are then diced and flip chip mounted and aligned on a foreign platform. The foreign platform may be a Si substrate. The regions are aligned accurately, then thermally or pressure bonded to the platform. Adhesion can be provided by a metal layer for example, using metal to metal bonding.

As the emission energy of the quantum dot in the second region 7 is controlled, it is possible to tune the output characteristics of two independent photon sources to be similar enough to allow entanglement. This allows entanglement of photons emitted from different sources which has applications for quantum repeaters and quantum computing.

For example, in quantum computing the ability to entangle photons from different sources allows the entanglement of solid state qubits.

Figure 21:
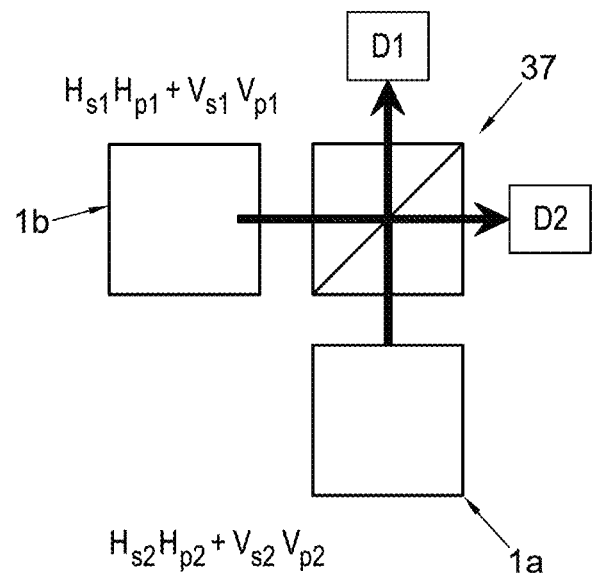
FIG. 21 is a schematic illustration of a system for producing entanglement through interference of photons from separate sources in accordance with an embodiment.

FIG. 21 is a schematic illustration of a system for producing entanglement through interference of photons from separate sources in accordance with an embodiment. The system comprises a first photon source 1a such as described in relation to FIGS. 1 to 16 above and a second photon source 1b such as described in relation to FIGS. 1 to 16 above, the first and second photon sources 1a and 1b being tuned to emit identical photons.

An interference component, for example a beam splitter 37, is configured to provide entanglement between identical photons output from the two photon sources 1a and 1b.

The first photon source 1a and the second photon source 1b are configured to have identical emission energies. The photon sources 1a and 1b are also configured such that they emit photons due to bi-exciton or charged-exciton decay. The first source 1a and the second source 1b emit a single photon each leaving either an electron-hole pair or a single charge within the dot.

Each photon produced due to this decay is entangled with the solid state cubit formed by the spin of the carriers or carrier remaining in the quantum dot. If identical photons due to decay are incident on beam splitter 37 from two different photon sources at the same time and an appropriate measurement is performed by detectors D1 and D2, the photons will become entangled. This serves to entangle the solid state qubits ire sources 1a and 1b with each other.

Figure 22:
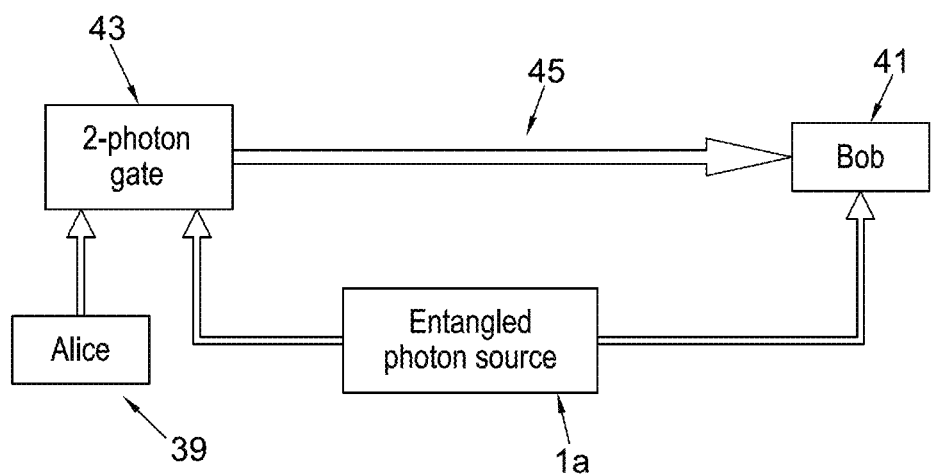
FIG. 22 is a schematic illustration of a quantum communication system in accordance with an embodiment, which implements a quantum repeater operation.

FIG. 22 is a schematic illustration of a quantum communication system in accordance with an embodiment, which implements a quantum repeater operation. To send information encoded on single photons over long distances, it is desirable to use, quantum repeater, enabling an increase in the distance over which quantum information can be sent from transmitter Alice 39 to receiver Bob 41.

The system comprises a 2 photon gate 43, a first photon source 1a such as described in relation to FIGS. 1 to 16 above and a classical channel 45. The two photon gate 43 comprises an interference component which may be an interferometer or a beam splitter for example.

The transmitter device at Alice 39 comprises a second single photon source 1b such as described in relation to FIGS. 1 to 16 above. The first photon source 1a is an entangled photon source and produces an entangled pair of photons. One of the pair of entangled photons is sent to the 2 photon gate 43 and one of the pair of entangled photons is sent to the receiver Bob 41. The photon from the entangled photon source 1a sent to the 2-photon gate 43 is identical to the photon emitted by Alice 39. The two-photon gate 43 performs a measurement which compares the photon from Alice 39 and the photon from the entangled photon source 1a. Based on the result of this measurement, classical information is transmitted to Bob 41 via a channel 45.

Bob 41 uses this information to perform a transformation (A(φ)) on the photon sent from the entangled photon source 1a to Bob 41. This converts its quantum state to the same as the initial photon generated by Alice 39. In this manner, the photon which Peached Bob 41 contains the quantum information sent by Alice 39, and this information has been transmitted over a larger distance than would have been possible had Alice 39 sent her photon directly.

The system is a quantum repeater, comprising a first photon source 1a such as described in relation to FIGS. 1 to 16 above, a second photon source 1b such as described in relation to FIGS. 1 to 16 above and an interference component configured to interfere a first photon from a pair of photons output by the first source a and a photon from the second source 1b, wherein the first photon source 1a is configured to output an entangled pair of photons wherein one of the photons is identical to a photon outputted by the second photon source 1b, such that during interference by said component, the state of a photon emitted by the second photon source 1b is mapped to the second photon from said photon pair.

In an embodiment, the photon source 1 described in relation to FIGS. 1 to 18 above is a single photon source. Emission from just a single quantum of exits the photon source. For example, the photon source may comprise just a single quantum dot in the second region 7. Alternatively, the device may comprise art opaque layer, with a gap aligned with a single quantum dot in the second region 7, allowing emission from the single quantum dot only to exit the photon source.

The photon source may be used in, quantum networking or quantum computing. Alternatively, the photon source may be an entangled photon source used in quantum metrology or in a quantum repeater.

The electrical carrier injection and tuning capability are integrated on a single hetero-structure. For an entangled photon source, minimization of the fine structure splitting occurs on the same chip as the excitation.

While certain embodiments have been described, these embodiments have been presented by way of example only, and are not intended to limit the scope of the inventions. Indeed the novel methods and apparatus described herein may be embodied in a variety of other forms; furthermore, various omissions, substitutions and changes in the form of methods and apparatus described herein may be made without departing from the spirit of the inventions. The accompanying claims and their equivalents are intended to cover such forms of modifications as would fall within the scope and spirit of the inventions.

The invention claimed is:

1. A method of using a photon source, the photon source comprising a semiconductor structure comprising a first light emitting diode region and a second region comprising a quantum dot; the photon source further comprising a first voltage source configured to apply an electric field across the first light emitting diode region and a second voltage source configured to apply a voltage that causes a tuneable electric field across the second region, the method comprising:

applying the electric field across said first light emitting diode region, by way of the first voltage source, to cause light emission by spontaneous emission, wherein the light emitted from said first light emitting diode region is absorbed in said second region and produces carriers to populate said quantum dot, such that carriers are injected into the quantum dot by optical excitation; and applying the tuneable electric field across said second region, by way of the second voltage source, to control emission energy of said quantum dot, wherein the voltage applied by the second voltage source is less than a threshold voltage of the second region wherein the light emitted from the second region exits said photon source.

2. The method according to claim 1, wherein the second region further comprises at least one barrier layer.

3. The method according to claim 2, wherein the at least one barrier layer comprises an un-doped layer.

4. The method according to claim 3, wherein the at least one barrier layer has a higher potential, for at least a part of its thickness, than the lowest electron energy level in the quantum dot.

5. The method according to claim 1, wherein carriers are injected into the quantum dot by optical excitation.

6. The method according to claim 1, wherein the energy of the light emitted from the first light emitting diode region is greater than the energy of the light emitted from the second region.

7. The method according to claim 6, wherein features of an absorption spectrum as a function of wavelength of the second region are substantially matched to features of an emission spectrum of the first region.

8. The method according to claim 1, wherein the second region is arranged at least partly around the first light emitting diode region.

9. The method according to claim 1, wherein the second region further comprises a plurality of quantum dots, wherein light emitted from said first light emitting diode region produces carriers to populate said quantum dots.

10. The method according to claim 1, wherein the second voltage source is a DC voltage source.

11. The method according to claim 1, wherein the first voltage source applies a time varying electric field to the first light emitting diode region.

12. The method according to claim 1, wherein the electric field is tuned across an operating range having an upper limit of 100 KC cm-1.

13. The method according to claim 12, wherein a tunnelling time of carriers from said quantum dot is greater than a radiative decay time of an exciton in said quantum dot over said operating range.

14. The method according to claim 1, wherein the photon source further comprises a waveguide region, wherein the method further comprises:

guiding light emitted from the first light emitting diode region to the second region using the waveguide region.

15. The method according to claim 1, wherein the first region and second region share an electrical contact region of a first type and each have a separate electrical contact region of a second type.

16. The method according to claim 1, wherein the light emitted from said first light emitting diode region consists of spontaneous photons that are not amplified by stimulated emission.

17. The method according to claim 2, wherein the second region further comprising an electrical contact region, wherein the at least one barrier layer is provided between the quantum dot and the electrical contact region.

* * * * *